(12) United States Patent
Wang et al.

(10) Patent No.: US 7,550,302 B2
(45) Date of Patent: Jun. 23, 2009

(54) METHOD OF MANUFACTURING SEMICONDUCTOR DEVICE

(75) Inventors: Wensheng Wang, Kawasaki (JP); Masaaki Nakabayashi, Kawasaki (JP); Katsuyoshi Matsuura, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 11/554,300

(22) Filed: Oct. 30, 2006

(65) Prior Publication Data

US 2008/0003700 A1 Jan. 3, 2008

(30) Foreign Application Priority Data

Jun. 30, 1966 (JP) ............................. 2006-182308

(51) Int. Cl.
*H01G 7/06* (2006.01)
(52) U.S. Cl. .................................. 438/3; 257/E27.104
(58) Field of Classification Search .................... 438/3; 257/295, E21.664, E21.663, E27.104, E21.208, 257/E29.164
See application file for complete search history.

(56) References Cited

U.S. PATENT DOCUMENTS

| | | | |
|---|---|---|---|
| 6,812,510 B2 | 11/2004 | Horri et al. | |
| 6,855,974 B2 | 2/2005 | Matsuura et al. | |
| 2002/0127867 A1* | 9/2002 | Lee | 438/694 |
| 2004/0135183 A1* | 7/2004 | Matsuura et al. | 257/295 |
| 2004/0164323 A1* | 8/2004 | Joo et al. | 257/200 |
| 2005/0233476 A1* | 10/2005 | Tatsunari | 438/3 |
| 2006/0231880 A1* | 10/2006 | Yamakawa et al. | 257/306 |

FOREIGN PATENT DOCUMENTS

| | | |
|---|---|---|
| JP | 2004-22702 A | 1/2004 |
| JP | 2004-186517 A | 7/2004 |
| JP | 2004-214569 A | 7/2004 |

* cited by examiner

*Primary Examiner*—Thao P. Le
(74) *Attorney, Agent, or Firm*—Westerman, Hattori, Daniels & Adrian, LLP.

(57) ABSTRACT

The present invention provides a method of manufacturing a semiconductor device. The method includes the steps of forming a first interlayer insulating film over a silicon substrate; forming a first conductive film on the first interlayer insulating film; forming a first ferroelectric film, which is crystallized, on the first conductive film; annealing the first ferroelectric film; after the annealing, forming, on the first ferroelectric film, a second ferroelectric film made of an amorphous material or a microcrystalline material; forming a second conductive film on the second ferroelectric film; and forming a capacitor by patterning the first and second conductive films and the first and second ferroelectric films.

19 Claims, 40 Drawing Sheets

METHOD OF MANUFACTURING SEMICONDUCTOR DEVICE

CROSS-REFERENCE TO RELATED APPLICATIONS

This application is based on and claims priority of Japanese Patent Application No. 2006-182308 filed on Jun. 30, 2006, the entire contents of which are incorporated herein by reference.

BACKGROUND OF THE INVENTION

1. Field of the Invention

The present invention relates to a method of manufacturing a semiconductor device.

2. Description of the Related Art

In recent years, with progress of digital technology, nonvolatile memories, in which a large volume of data can be stored at a high speed, have been developed.

As such nonvolatile memories, flush memories and ferroelectric memories are known.

Of these, flush memories have a floating gate buried in a gate insulating film of an insulated-gate field-effect transistor (IGFET), and accumulate, in this floating gate, charge representing information to be stored, thus storing the information. However, in the flash memory, tunnel current needs to be passed through the gate insulating film when information is written or deleted. Therefore, the flash memory has a disadvantage that a relatively high voltage is needed.

Meanwhile, ferroelectric memories are also called ferroelectric random access memories (FeRAMs), and store information by utilizing hysteresis characteristics of a ferroelectric film provided in a ferroelectric capacitor. The ferroelectric film is polarized according to a voltage applied between upper and lower electrodes of the capacitor, and retains spontaneous polarization even when the voltage is removed. When the polarization of the applied voltage is reversed, the spontaneous polarization is also reversed. Information is written to the ferroelectric film by use of the orientation of the spontaneous polarization associated with "1" or "0." Voltage needed for this writing is lower than that for flash memories. Moreover, FeRAMs have an advantage that writing can be performed at a high speed compared to a case of flash memories.

The performance of a ferroelectric capacitor provided in an FeRAM greatly depends on a film quality of a ferroelectric film. Accordingly, in order to provide high-quality FeRAMs, many studies have been conducted for optimization of a method of depositing a ferroelectric film, the heat treatment of a ferroelectric film, and the like.

For example, Japanese Patent Application No. 2004-214569 (hereinafter referred to as Patent Document 1) proposes that a capacitor dielectric film be formed in a two-layer structure including first and second ferroelectric films. The deposition temperature of the first ferroelectric film is set at a temperature at which the first ferroelectric film is caused to have a crystallized structure exhibiting ferroelectricity. On the other hand, the deposition temperature of the second ferroelectric film is set lower than a temperature at which the second ferroelectric film is caused to have a crystallized structure exhibiting ferroelectricity. According to Patent Document 1, such a structure improves fatigue of a ferroelectric capacitor.

In Japanese Patent Application No. 2004-186517 (hereinafter referred to as Patent Document 2), in order to prevent the leakage current of a capacitor from increasing, first ferroelectric films and second ferroelectric films thicker than the first ferroelectric films are alternately stacked to form a capacitor dielectric film having a multilayer structure. In this case, the first ferroelectric films are subjected to rapid thermal anneal (RTA).

Furthermore, in Japanese Patent Application No. 2004-22702 (hereinafter referred to as Patent Document 3), a ferroelectric film, which is already crystallized at the time of deposition thereof, is formed by metal organic chemical vapor deposition (MOCVD). Then, heat treatment is performed on the ferroelectric film at a temperature higher than the deposition temperature thereof by 40° C. or more, thus improving the fatigue of a ferroelectric capacitor.

Indicators of the performance of a ferroelectric capacitor include a switching charge amount and imprint characteristics in addition to the above-described leakage current and fatigue. Ideally, it is preferable that all of the above be simultaneously improved.

However, the technologies described in Patent Documents 1 to 3 cannot simultaneously improve all of these characteristics, and cannot meet the demand for higher performance of FeRAMs.

For example, according to FIG. 3 of Patent Document 1, the number of polarization reversals, at which a decrease in a switching charge amount (Qsw) starts to be obvious, can be made one or two orders of magnitude larger than that in conventional cases. However, when the number of polarization reversals is approximately $10^6$, the switching charge amount (Qsw) greatly decreases. The technology of Patent Document 1 cannot meet this demand for FeRAMs to have such a life that the switching charge amount does not decrease even when the number of polarization reversals becomes $10^{10}$ or more.

Moreover, with the technology of Patent Document 2, leakage current is indeed reduced by forming a capacitor dielectric film having a multilayer structure. However, there arises another problem in which a process is complicated when a multilayer structure having three or more layers is employed.

On the other hand, with the technology of Patent Document 3, the fatigue and imprint characteristics of a capacitor are improved. However, as shown in FIG. 10 of Patent Document 3, there is a problem that the switching charge amount decreases due to the annealing of a ferroelectric film.

SUMMARY OF THE INVENTION

According to one aspect of the present invention, a method of manufacturing a semiconductor device is provided. The method includes the steps of forming a first interlayer insulating film over a semiconductor substrate; forming a first conductive film on the first interlayer insulating film; forming a first ferroelectric film, which is crystallized, on the first conductive film; annealing the first ferroelectric film; after the annealing, forming a second ferroelectric film made of any one of an amorphous material and a microcrystalline material on the first ferroelectric film; forming a second conductive film on the second ferroelectric film; and forming a capacitor including a lower electrode, a capacitor dielectric film, and an upper electrode by patterning the first conductive film, the first ferroelectric film, the second ferroelectric film, and the second conductive film.

In the present invention, the annealing of the first ferroelectric film causes impurities such as water and organic materials contained in the first ferroelectric film to be expelled to the outside of the film. Thus, it is made possible to provide a semiconductor device including a capacitor in which an increase in the switching charge amount, a decrease in the leakage current, a decrease in the fatigue, and an improvement in the imprint characteristics are simultaneously achieved.

Furthermore, since the second ferroelectric film is formed of the amorphous material or the microcrystalline material, elements of the second conductive film, which diffuse into the capacitor dielectric film, remain in the second ferroelectric film, and are less prone to reach the first ferroelectric film. As a result, the above-described elements are less prone to diffuse into grain boundaries of the first ferroelectric film which is crystallized to show excellent ferroelectric characteristics. Accordingly, leakage paths are prevented from being formed by the elements, and it is made possible to effectively prevent the leakage current of the capacitor.

In this event, when the second ferroelectric film is thicker than the first ferroelectric film, the remanent polarization charge amount of the capacitor dielectric film decreases. For this reason, the thickness of the second ferroelectric film is preferably equal to, or less than, 40% of that of the first ferroelectric film.

Moreover, the step of forming the second conductive film is preferably includes the steps of forming a first metal oxide film; forming, on the first metal oxide film, a second metal oxide film containing a larger amount of oxygen than that in the first metal oxide film; and forming a conductivity-improving film on the second metal oxide film.

The second metal oxide film thus containing a large amount of oxygen inhibits the catalysis of the second metal oxide film. Accordingly, even when external water is brought into contact with the second metal oxide film, hydrogen is less prone to be generated. Thus, it is made possible to prevent deterioration of ferroelectric characteristics of the first and second ferroelectric films, the deterioration stemming from reduction by hydrogen.

The first metal oxide film may be annealed in an oxygen-containing atmosphere after the step of forming the first metal oxide film and before the step of forming the second metal oxide film. This annealing compensates oxygen deficiency in the first and second ferroelectric films, and planarizes unevenness at the interface between the first metal oxide film and the second ferroelectric film.

DESCRIPTION OF THE PREFERRED EMBODIMENTS

Next, embodiments of the present invention will be described in detail with reference to the accompanying drawings.

(1) First Embodiment

Figure 1A:
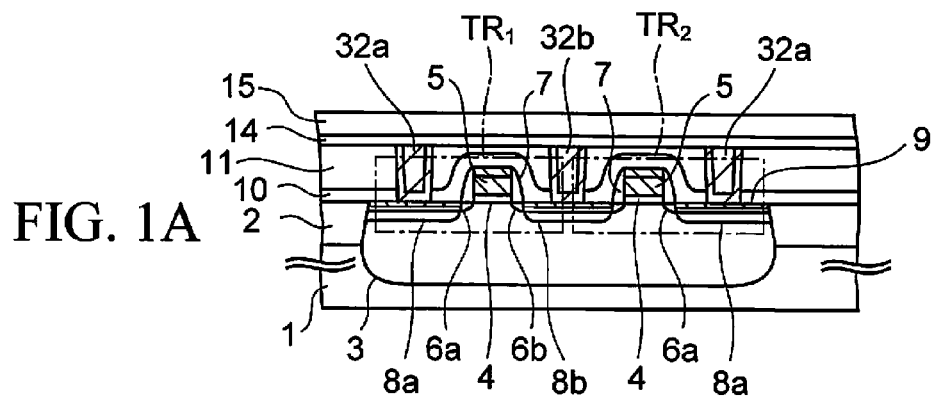
FIGS. 1A to 1W are cross-sectional views of a semiconductor device according to a first embodiment of the present invention, the semiconductor device being in a process of being manufactured.
Figure 1B:
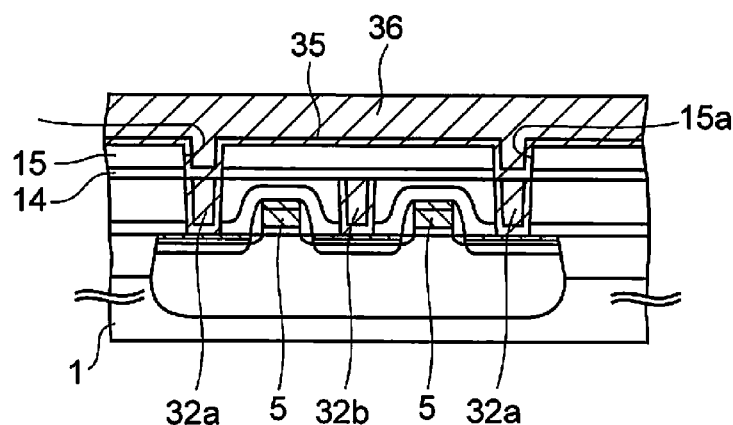
Figure 1C:
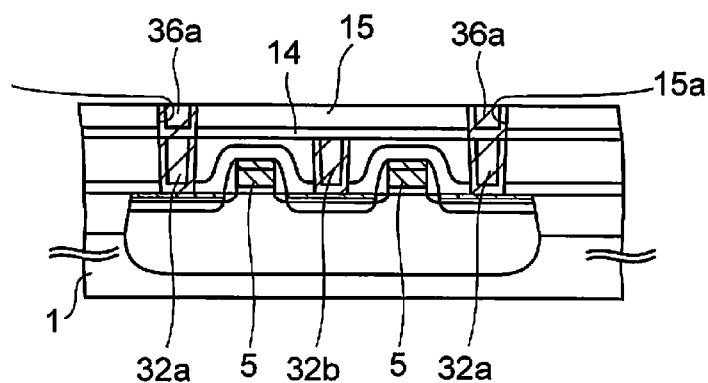
Figure 1D:
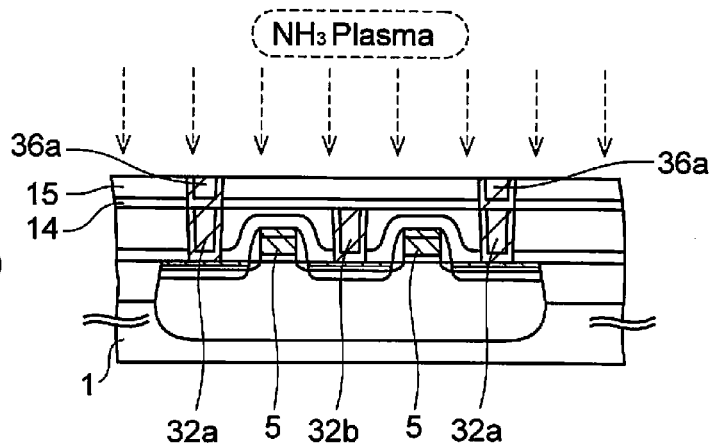
Figure 1E:
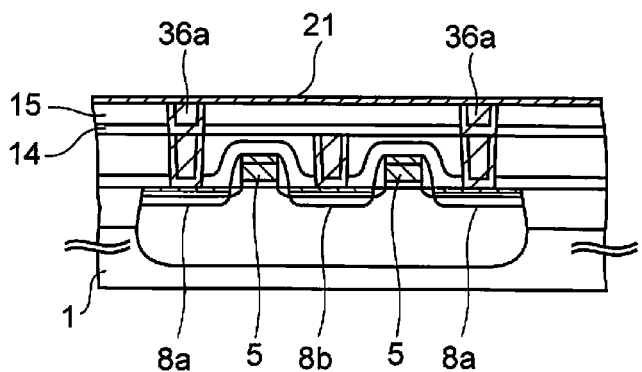
Figure 1F:
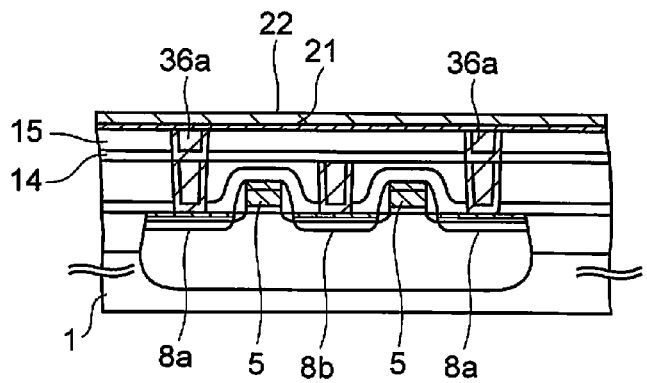
Figure 1G:
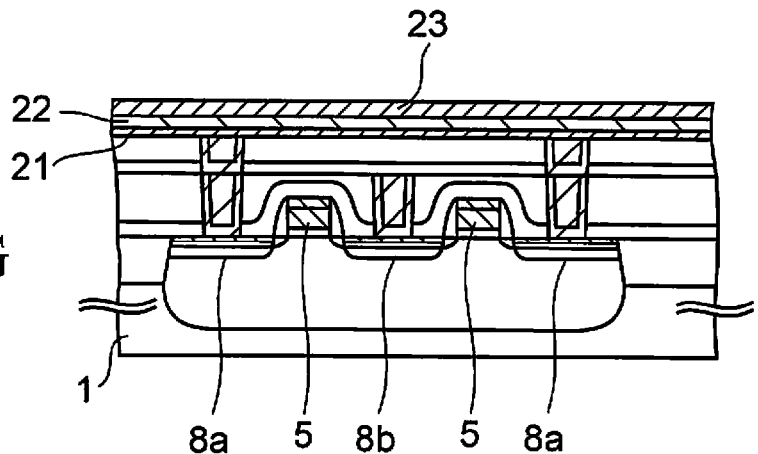
Figure 1H:
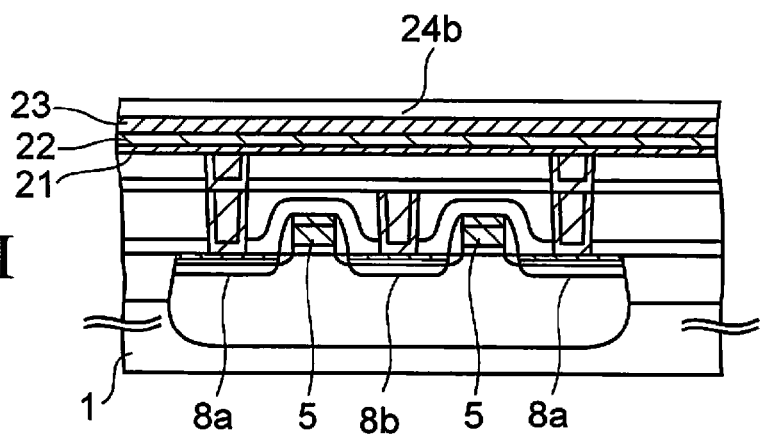
Figure 1I:
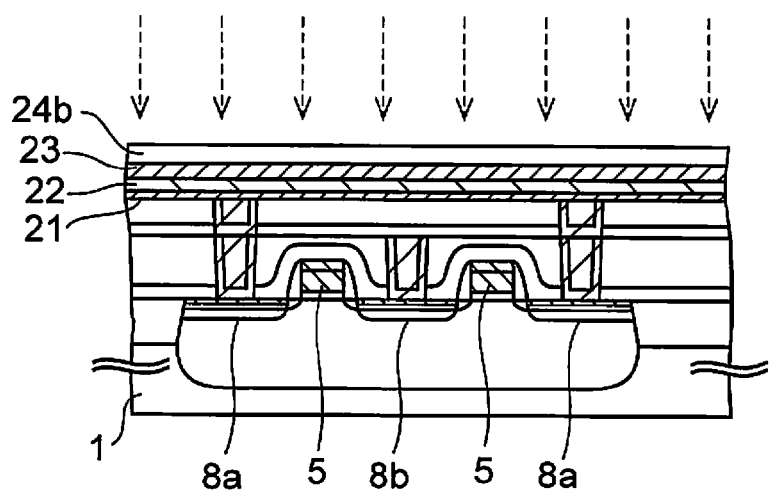
Figure 1J:
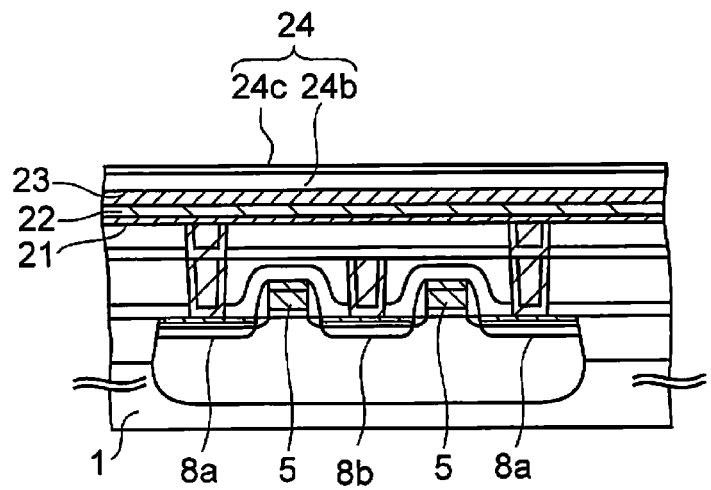
Figure 1K:
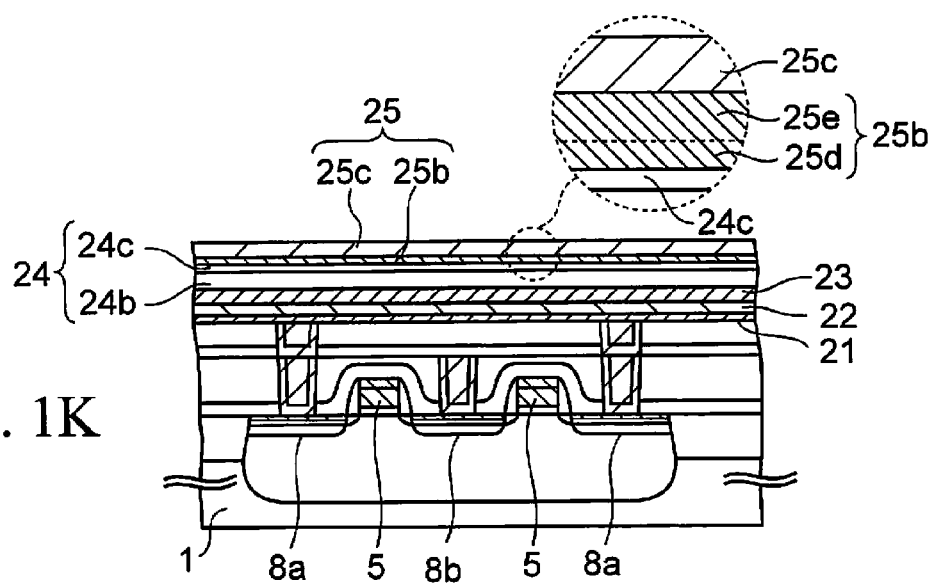
Figure 1L:
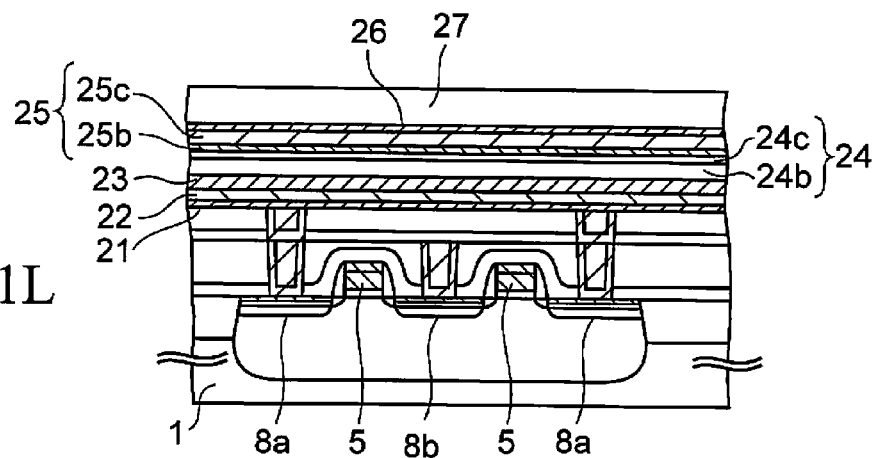
Figure 1M:
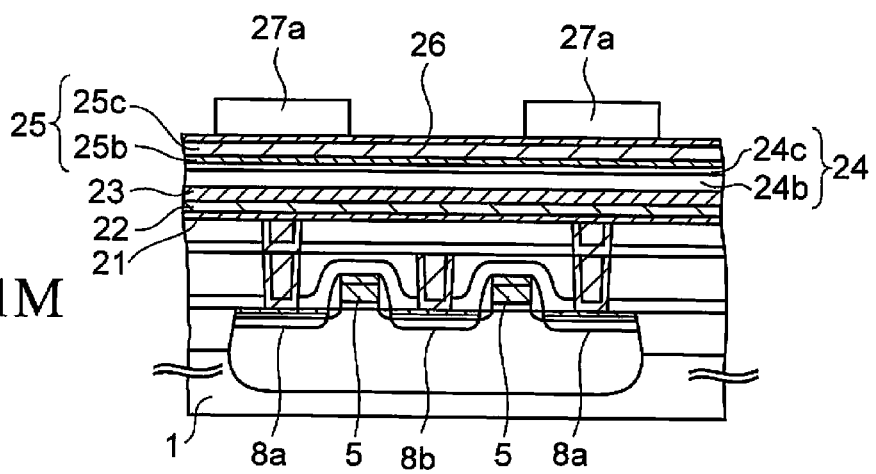
Figure 1N:
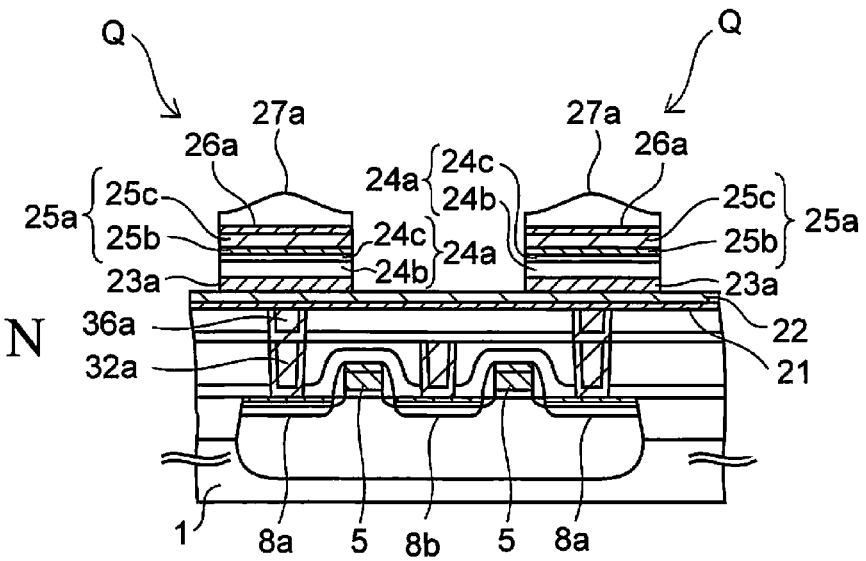
Figure 1O:
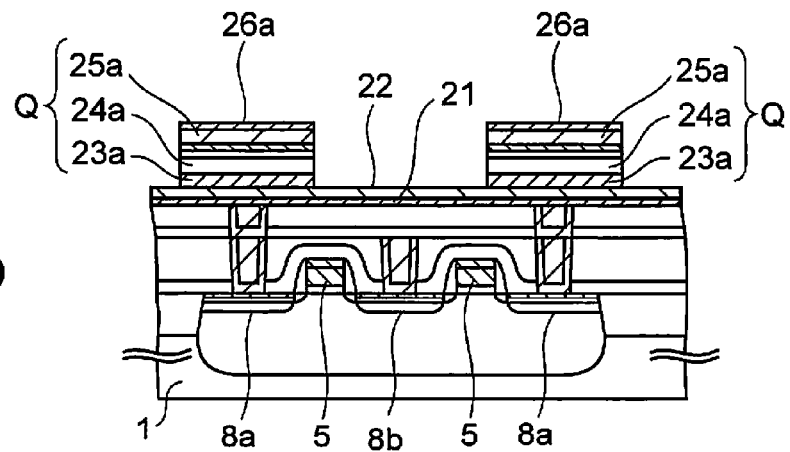
Figure 1P:
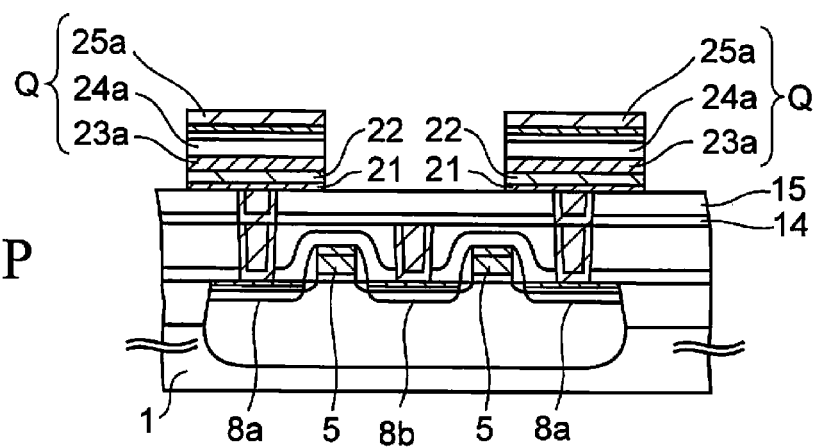
Figure 1Q:
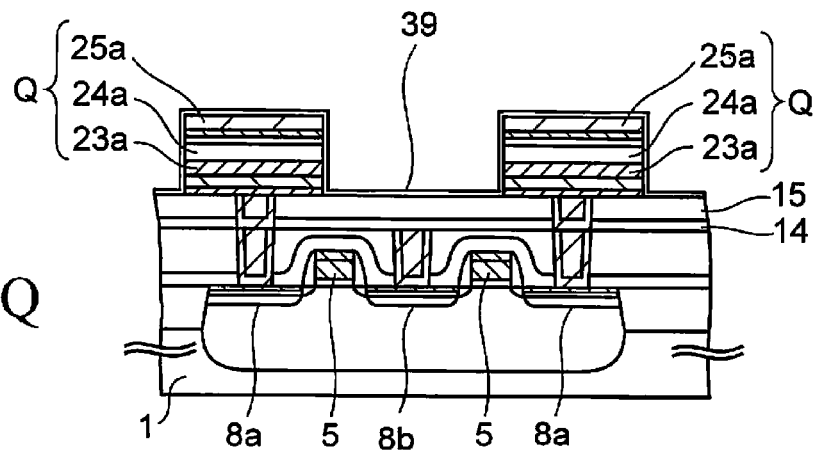
Figure 1R:
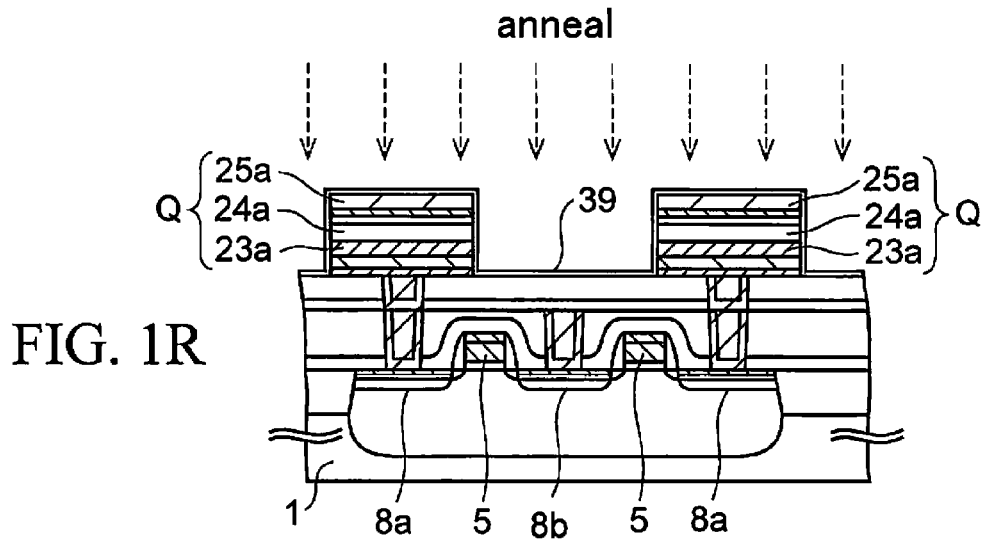
Figure 1S:
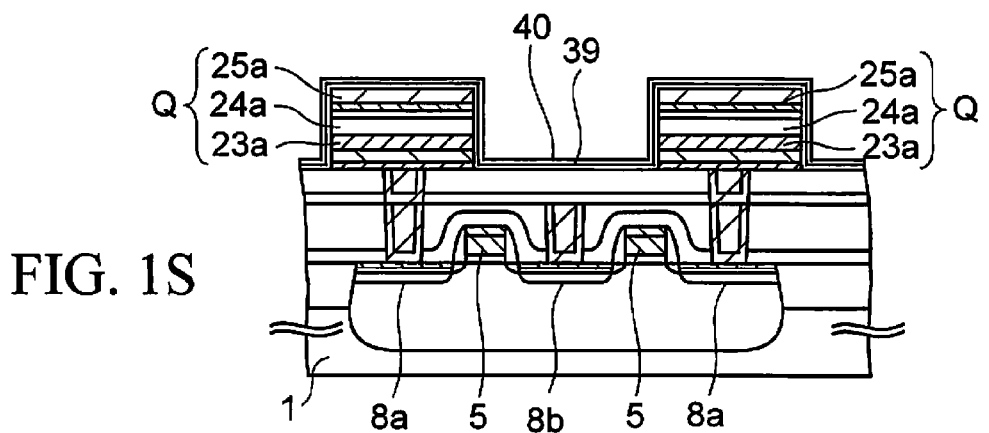
Figure 1T:
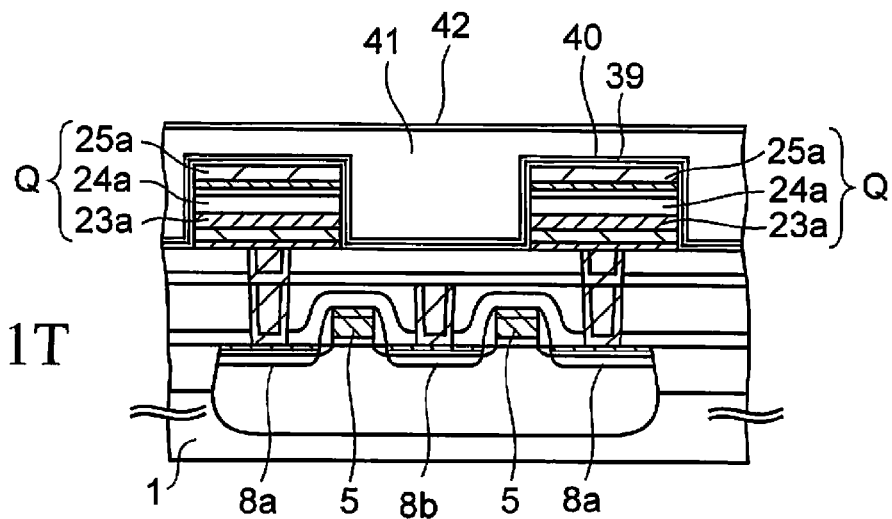
Figure 1U:
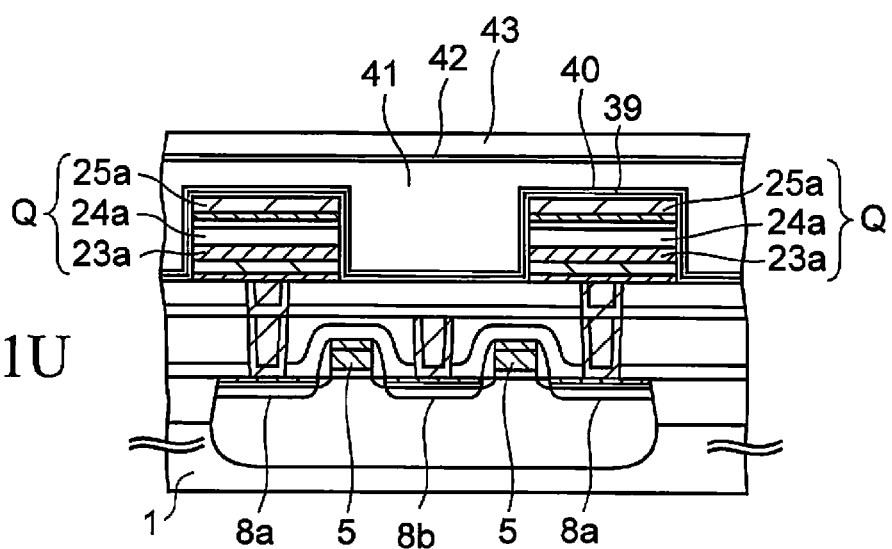
Figure 1V:
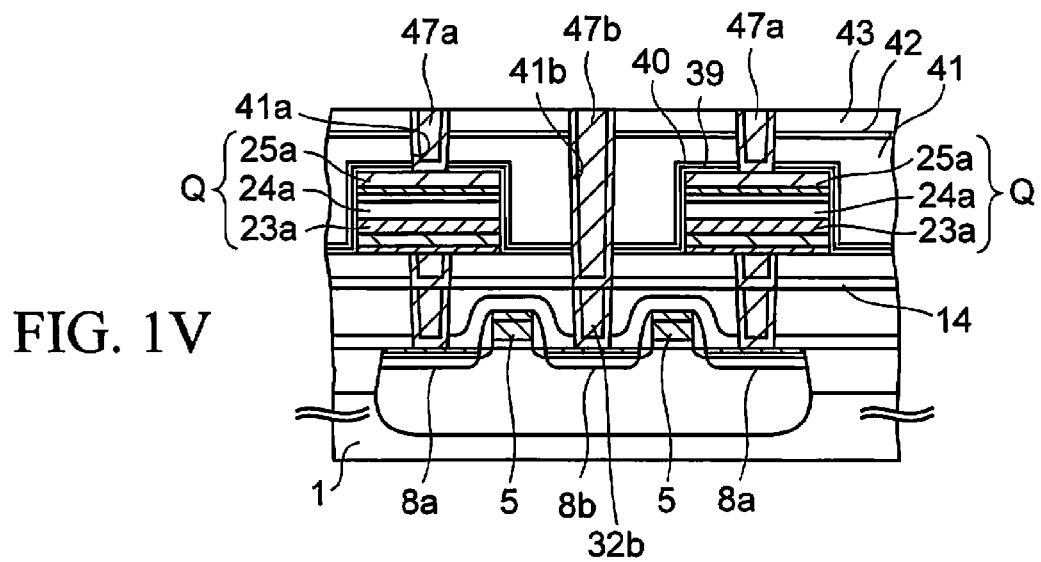
Figure 1W:
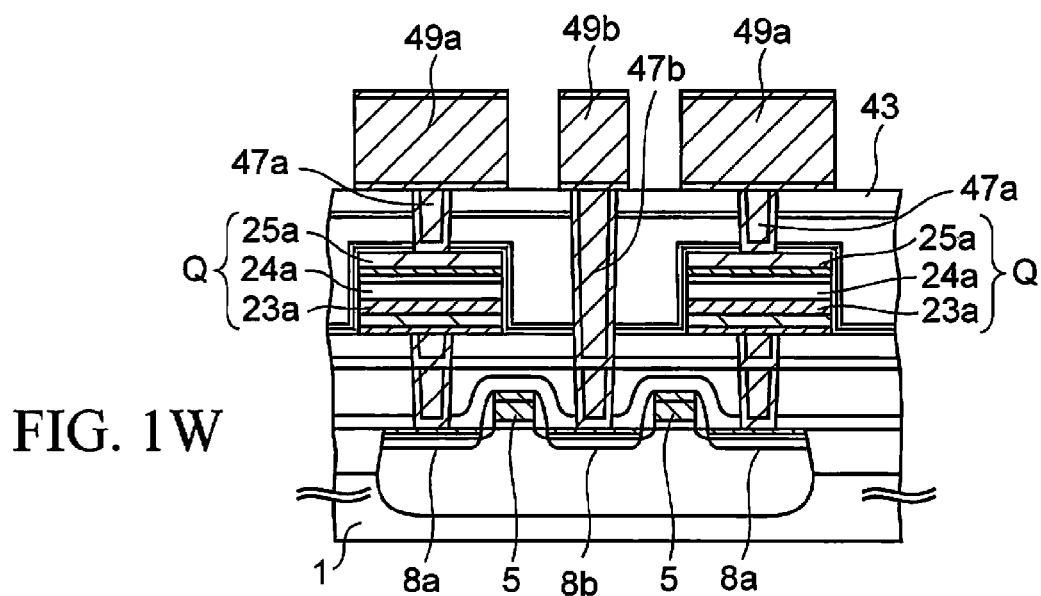

FIGS. 1A to 1W are cross-sectional views of a semiconductor device according to a first embodiment in the process of being manufactured.

This semiconductor device is a stack-type FeRAM advantageous in miniaturization, and is fabricated as follows.

At the beginning, steps for obtaining the cross-sectional structure shown in FIG. 1A will be described.

First, on a surface of an n- or p-type silicon (semiconductor) substrate 1, a groove for shallow trench isolation (STI), which defines an active region for transistors, is formed, and the inside of the groove is filled with an insulating film made of silicon oxide or the like which is used as an element isolation insulating film 2. Incidentally, an element isolation structure is not limited to STI, and the element isolation insulating film 2 may be formed by local oxidation of silicon (LOCOS).

Next, a p-type impurity is introduced into the active region of the silicon substrate 1 to form a p-well 3. Then, the surface of the active region is thermally oxidized, thereby forming a thermally oxidized film which is to be a gate insulating films 4.

Subsequently, an amorphous or polycrystalline silicon film is formed on the entire upper surface of the silicon substrate 1, and the silicon film is patterned by photolithography. Thereby, two gate electrodes 5 are formed.

On the p-well 3, the above-described two gate electrodes 5 are placed in parallel and apart from each other. These gate electrodes 5 constitute portions of word lines.

Then, an n-type impurity is introduced into the silicon substrate 1 beside the gate electrodes 5 by ion implantation using the gate electrodes 5 as masks. Accordingly, first and second source/drain extensions 6a and 6b are formed.

Thereafter, an insulating film is formed on the entire upper surface of the silicon substrate 1, and the insulating film is etched back. Thereby, insulating sidewalls 7 are formed on the side surfaces of the gate electrodes 5. As the insulating film, a silicon oxide film is formed by CVD, for example.

Subsequently, ions of an n-type impurity are again implanted into the silicon substrate 1 using the insulating sidewalls 7 and the gate electrodes 5 as masks. Thereby, first and second source/drain regions (first and second impurity diffusion regions) 8a and 8b, which are located apart from each other, are formed in the surface layer of the silicon substrate 1 beside the two gate electrodes 5.

With the steps described so far, first and second MOS transistors $TR_1$ and $TR_2$ including the gate insulating films 4, the gate electrodes 5, and the first and second source/drain regions 8a and 8b are formed in the active region of the silicon substrate 1.

Next, a refractory metal layer, such as a cobalt layer, is formed on the entire upper surface of the silicon substrate 1 by sputtering. Then, this refractory metal layer is heated to be reacted with silicon. Thus, a refractory metal silicide layer 9 is formed on the silicon substrate 1. The refractory metal silicide layer 9 is also formed in surface layer portions of the gate electrodes 5. Thereby, the resistances of the gate electrodes 5 are reduced.

Thereafter, unreacted portions of the refractory metal layer, which are on the element isolation insulating film 2 and the like, are removed by wet etching.

Subsequently, by use of plasma CVD, a silicon nitride (SiN) film is formed on the entire upper surface of the silicon substrate 1. The silicon nitride film is formed to have a thickness of approximately 80 nm, and is used as a cover insulating film 10. Then, by means of plasma CVD using a TEOS gas, a silicon oxide film is formed as a first interlayer insulating film 11 on this cover insulating film 10. The silicon oxide film is formed to have a thickness of approximately 1000 nm.

After that, the upper surface of the first interlayer insulating film 11 is polished and planarized by chemical mechanical polishing (CMP). As a result of this CMP, the thickness of the first interlayer insulating film 11 is approximately 700 nm on the flat surface of the silicon substrate 1.

Subsequently, the cover insulating film 10 and the first interlayer insulating film 11 are patterned by photolithography. Thereby, contact holes having diameters of 0.25 μm are formed over the first and second source/drain regions 8a and 8b. Furthermore, a glue film (adhesion film) and a tungsten film are formed in this order in these contact holes. Thereafter, unnecessary portions of the glue film and of the tungsten film on the first interlayer insulating film 11 are polished and removed by CMP to leave these films only in the contact holes as first and second conductive plugs 32a and 32b.

These first and second conductive plugs 32a and 32b are electrically connected to the first and second source/drain regions 8a and 8b, respectively.

Incidentally, the above-described glue film is made by forming a titanium film having a thickness of approximately 30 nm and a titanium nitride film having a thickness of approximately 20 nm in this order. The tungsten film before the CMP has a thickness of approximately 300 nm on the first interlayer insulating film 11.

In this event, the first and second conductive plugs 32a and 32b consist primarily of tungsten prone to oxidation. The oxidation of the first and second conductive plugs 32a and 32b in the process may cause a contact failure.

Accordingly, as an anti-oxidation insulating film 14 for preventing the oxidation of the conductive plugs 32a and 32b, a silicon oxynitride (SiON) film is formed on these plugs 32a and 32b and the first interlayer insulating film 11 by plasma CVD. The silicon oxynitride film is formed to have a thickness of approximately 200 nm.

Note that, instead of the silicon oxynitride film, a silicon nitride (SiN) film or an alumina film may be formed as the anti-oxidation insulating film 14.

Thereafter, by means of plasma CVD using a TEOS gas, a silicon oxide film is formed on the anti-oxidation insulating film 14. This silicon oxide film is formed to have a thickness of approximately 300 nm, and is used as an underlying insulating film 15.

Next, steps for obtaining the cross-sectional structure shown in FIG. 1B will be described.

First, the underlying insulating film 15 and the anti-oxidation insulating film 14 are patterned. Thereby, first holes 15a are formed in these insulating films over the first conductive plugs 32a.

Subsequently, by use of sputtering, a titanium nitride film, which is to be a glue film 35, is formed in the first holes 15a and on the underlying insulating film 15.

Furthermore, a tungsten film is formed as a plug conductive film 36 on the glue film 35 by CVD. Thereby, the first holes 15a are completely buried with the plug conductive film 36.

Thereafter, as shown in FIG. 1C, unnecessary portions of the glue film 35 and the plug conductive film 36 on the second insulating film 36 are polished and removed by CMP. As a result, the glue film 35 and the plug conductive film 36 are left in the first holes 15a as third conductive plugs 36a electrically connected to the first conductive plugs 32a.

In this CMP, such a slurry is used that polishing speeds respectively of the glue film 35 and of the plug conductive film 36 to be polished are faster than a polishing speed of the underlying insulating film 15 thereunder, e.g., W2000 manufactured by Cabot Microelectronics Corporation. In addition, in order to prevent unpolished portions from being left on the underlying insulating film 15, the amount polished with this CMP is set larger than the total thickness of the films 35 and 36. As a result, over polishing occurs with this CMP.

Next, as shown in FIG. 1D, the underlying insulating film 15 made of silicon oxide is exposed to a nitrogen-containing plasma, e.g., an ammonia ($NH_3$) plasma. Thereby, NH groups are bonded to oxygen atoms on the surface of the underlying insulating film 15.

In this ammonia plasma treatment, a parallel-plate plasma treatment system is used, for example. The parallel-plate plasma treatment system has an opposing electrode at a distance of approximately 9 mm (350 mils) from the silicon substrate 1. While the substrate temperature is maintained at 400° C. at a pressure of 266 Pa (2 Torr), an ammonia gas is supplied to the inside of a chamber at a flow rate of 350 sccm, and the treatment is performed by supplying a high-frequency power of 100 W at 13.56 MHz to the silicon substrate 1 for 60 seconds and a high-frequency power of 55 W at 350 kHz to the above-described opposing electrode for 60 seconds.

Subsequently, as shown in FIG. 1E, a titanium film is formed on the underlying insulating film 15 and the third conductive plugs 36a. This titanium film is formed to have a thickness of approximately 20 nm, and is used as an underlying conductive film 21.

Deposition conditions for this underlying conductive film 21 are not particularly limited. In this embodiment, a sputtering chamber, in which the distance between the silicon substrate 1 and a titanium target is set to be 60 mm, is used. The substrate temperature is set at 20° C. in an argon atmosphere at 0.15 Pa. The underlying conductive film 21 made of titanium is formed by supplying a DC power of 2.6 kW to the chamber for five seconds.

In this event, ammonia plasma treatment (see FIG. 1D) has been performed in advance, and NH groups have been bonded to oxygen atoms on the surface of the underlying insulating film 15. Accordingly, titanium atoms deposited on the underlying insulating film 15 are less prone to be captured by oxygen atoms on the surface of the underlying insulating film 15. Thus, the titanium atoms can freely move on the surface of the underlying insulating film 15. It is thereby made possible to form the underlying conductive film 21 made of titanium which is strongly self-oriented in the (002) direction.

Thereafter, RTA, in which the substrate temperature and the treatment time are respectively set to be 650° C. and 60 seconds, is performed on the underlying insulating film 21 in an nitrogen atmosphere. As a result, the underlying conductive film 21 made of titanium is nitrided, and the underlying conductive film 21 is formed of titanium nitride in a state of being oriented in the (111) direction.

Next, as shown in FIG. 1F, a titanium aluminum nitride (TiAlN) film is formed as a conductive oxygen barrier film 22 on the underlying conductive film 21. The titanium aluminum nitride film is formed to have a thickness of 100 nm by reactive sputtering.

The conductive oxygen barrier film 22 made of titanium aluminum nitride has an excellent functionality in preventing oxygen permeation, and has the role of preventing the third conductive plugs 36a thereunder from being oxidized and from causing a contact failure.

Deposition conditions for the conductive oxygen barrier film 22 are not particularly limited. In this embodiment, a target made of an alloy of titanium and aluminum is used, and a gas mixture of an argon gas and a nitrogen gas is used as a sputtering gas. The flow rates of the argon gas and the nitrogen gas are respectively set at 40 sccm and 100 sccm, and the conductive oxygen barrier film 22 is formed at a pressure of 253.3 Pa, a substrate temperature of 400° C., and a sputtering power of 1.0 kW.

Subsequently, as shown in FIG. 1G, an iridium film is formed as a first conductive film 23 on the conductive oxygen barrier film 22. The iridium film is formed to have a thickness of approximately 100 nm by sputtering. The iridium film is formed, for example, in an argon atmosphere at a pressure of 0.11 Pa by setting the substrate temperature at 500° C. and the sputtering power at 0.5 kW.

At this time, as described previously, the titanium nitride film constituting the underlying conductive film 21 is oriented in the (111) direction. Accordingly, the crystallinity of the underlying conductive film 21 is made favorable due to the action of this orientation.

Thereafter, in an argon atmosphere, RTA, in which the substrate temperature is set at a temperature of not lower than 650° C., is performed on the first conductive film 23 for 60 seconds. This RTA improves the adhesion between the first conductive film 23 and the conductive oxygen barrier film 22, and also improves the crystallinity of the first conductive film 23.

The first conductive film 23 is not limited to an iridium film. Instead of iridium, the first conductive film 23 may be formed of a platinum metal such as platinum or a conductive oxide made of PtO, IrOx, SrRuO$_3$, or the like. Furthermore, a film stack of the above-described metal or metal oxide may be formed as the first conductive film 23.

Subsequently, as shown in FIG. 1H, a lead zirconate titanate (PZT, PbZrTiO$_3$) film having a perovskite structure is formed on the first conductive film 23 by MOCVD. This PZT film is used as a first ferroelectric film 24b. The first ferroelectric film 24b formed by MOCVD has already been crystallized at the time of deposition. Accordingly, crystallization annealing for crystallizing the first ferroelectric film 24b is unnecessary.

The MOCVD is performed as follows.

First, each of Pb(DPM)$_2$ (chemical formula Pb(C$_{11}$H$_{19}$O$_2$)$_2$), Zr(dmhd)$_4$ (chemical formula Zr(C$_9$H$_{15}$O$_2$)$_4$), and Ti(O-iOr)$_2$(DPM)$_2$ (chemical formula Ti(C$_3$H$_7$O)$_2$(C$_{11}$H$_{19}$O$_2$)$_2$) is dissolved in a tetra hydro furan (THF: C$_4$H$_8$O) at a concentration of 0.3 mol/l. Thus, the respective liquid raw materials of Pb, Zr, and Ti are prepared. Subsequently, these liquid row materials are supplied to a vaporizer of an MOCVD system respectively at flow rates of 0.326 ml/min, 0.200 ml/min, and 0.200 ml/min to be vaporized. As a result, a source gas for Pb, Zr, and Ti is obtained. Incidentally, together with the liquid raw materials, a THF solvent is also supplied to the above-described vaporizer at a flow rate of 0.474 ml/min.

Furthermore, while the above-described source gas is supplied to the chamber, the pressure in the chamber is set at 665 Pa (5 Torr), and the substrate temperature is maintained at 620° C. By maintaining such a state for 620 seconds, the above-described PZT film is formed to have a thickness of 100 nm.

The first ferroelectric film 24b is not limited to a PZT film. The first ferroelectric film 24b may be formed of a material obtained by doping PZT with at least one of lanthanum, calcium, strontium, and silicon. Alternatively, the first ferroelectric film 24b may be formed of a Bi layered compound such as $(Bi_{1-x}R_x)Ti_3O_{12}$ (R is a rare-earth element, and 0<x<1), SrBi$_2$Ta$_2$O$_9$, or SrBi$_4$Ti$_4$O$_{15}$.

Moreover, the first ferroelectric film 24b may be formed of a high-dielectric metal oxide material containing zirconium or lead, instead of the ferroelectric material.

Note that when the first ferroelectric film 24b is formed by MOCVD as described above, organic materials contained in the source gas are also contained in the first ferroelectric film 24b.

Furthermore, after the first ferroelectric film 24b is formed, the silicon substrate 1 is taken out of the chamber of the MOCVD system. At this time, the first ferroelectric film 24b is exposed to the air, and very small amounts of water and carbon in the air are also absorbed into the first ferroelectric film 24b.

Impurities such as organic materials and water degrade ferroelectric characteristics, e.g., the remanent polarization charge amount, of the first ferroelectric film 24b. For this reason, impurities need to be expelled from the first ferroelectric film 24b.

Accordingly, in the next step, as shown in FIG. 1I, the first ferroelectric film 24b is annealed in an atmosphere containing an oxidizing gas to expel impurities in the first ferroelectric film 24b to the outside of the film.

Conditions for this annealing are not particularly limited. In this embodiment, the annealing is performed in a mixed atmosphere of an argon gas and oxygen by atmospheric-pressure RTA in which the substrate temperature is set at a temperature of 575° C. to 650° C., e.g., 600° C. In this case, the flow rates of the argon gas and oxygen are respectively set at 50 sccm and 2000 sccm, and the heat treatment time is set to be 30 seconds to 120 seconds, e.g., 60 seconds.

The oxidizing gas is not limited to an oxygen gas. Any one of an oxygen gas, an ozone gas, and a nitrogen dioxide (N$_2$O) gas may be used as the oxidizing gas.

By using such an oxidizing gas, organic materials in the first ferroelectric film 24b are oxidized, and are easily expelled to the outside of the film.

In this event, when the substrate temperature (annealing temperature) during annealing is too low, it is difficult for impurities to be expelled from the first ferroelectric film 24b, and the effect of annealing decreases. To sufficiently obtain the effect of annealing, the lower limit of the annealing temperature is preferably set at a temperature lower than the deposition temperature of the first ferroelectric film 24b by 45° C., more preferably by 25° C.

In the above example, since the first ferroelectric film 24b is formed at a substrate temperature of 620° C., the lower limit of the annealing temperature is preferably 575° C., more preferably 595° C.

On the other hand, when the annealing temperature is too high, lead of PZT constituting the first ferroelectric film 24b escapes, and ferroelectric characteristics, e.g., the remanent polarization charge amount, of the first ferroelectric film 24b degrade. Accordingly, the upper limit of the annealing temperature is preferably set at a temperature higher than the deposition temperature of the first ferroelectric film 24b by 30° C., more preferably by 10° C.

In this embodiment in which the first ferroelectric film 24b is formed at a substrate temperature of 620° C., the upper limit of the annealing temperature is preferably 650° C., more preferably 630° C.

Alternatively, the annealing may be performed by reduced-pressure RTA instead of atmospheric-pressure RTA. In reduced-pressure RTA, the pressure of an annealing atmosphere is reduced. Hence, impurities in the first ferroelectric film 24b are easily moved outside the film.

Accordingly, in the case where reduced-pressure RTA is employed, the lower and upper limits of the annealing temperature can be both set lower by approximately 10° C. than in the case of atmospheric-pressure RTA. For example, in the above example, the lower limit of the annealing temperature can be set at a temperature lower than the deposition temperature of the first ferroelectric film 24b by 55° C., and the upper limit thereof can be set at a temperature higher than the deposition temperature by 20° C.

Due to limitations of the capability of a pressure reducing apparatus, the pressure of annealing is preferably set at 0.1 to 100 Torr.

Next, as shown in FIG. 1J, a PZT film is formed as a second ferroelectric film 24c on the first ferroelectric film 24b by sputtering. These first and second ferroelectric films 24b and 24c are together used as a ferroelectric film 24.

Incidentally, after the annealing shown in FIG. 1I is performed on the first ferroelectric film 24b, even when the first ferroelectric film 24b is exposed to the air, impurities in the air are less prone to be introduced into the first ferroelectric film 24b compared to those in the case where annealing is not performed. Accordingly, there is no need to perform, for the purpose of preventing the first ferroelectric film 24b from being exposed to the air, the annealing and the deposition of the second ferroelectric film 24c in the same system. However, it is not preferable that the first ferroelectric film 24b be left in the air for a long time during a period after the annealing and before the deposition of the second ferroelectric film 24c. Therefore, it is desirable that the second ferroelectric film 24c be formed within 24 hours after the formation of the first ferroelectric film 24b.

Unlike the first ferroelectric film 24b formed by MOCVD, the second ferroelectric film 24c formed by sputtering is not crystallized at the time of deposition, but is amorphous.

Here, according to the result of a study conducted by the inventor of the present application, it has been revealed that, when the second ferroelectric film 24b is too thick, the remanent polarization charge amount of the ferroelectric film 24 is prone to decrease. A decrease in the remanent polarization charge amount makes it difficult to write or read information to/from a ferroelectric capacitor, and is therefore unfavorable.

For this reason, the thickness of the second ferroelectric film 24c is preferably a thickness smaller than that of the first ferroelectric film 24b, more preferably a thickness equal to 40% of that of the first ferroelectric film 24b. In the case of this embodiment, since the thickness of the first ferroelectric film 24b is 100 nm, a decrease in the remanent polarization charge amount can be prevented by forming the second ferroelectric film 24c to have a thickness of 5 to 30 nm, e.g. 20 nm.

In contrast to this, in Patent Document 2, since the second ferroelectric film is formed more thickly than the first ferroelectric film, there is the problem that the polarization charge amount decreases.

Note that the second ferroelectric film 24c is not limited to PZT.

The second ferroelectric film 24c may be formed of a ferroelectric material, which is similar to PZT having an $ABO_3$ perovskite structure (A=any one of Bi, Pb, Ba, Sr, Ca, Na, K, and rare-earth elements; B=any One of Ti, Zr, Nb, Ta, W, Mn, Fe, Co, and Cr).

Furthermore, the second ferroelectric film 24c may be formed of a material obtained by doping PZT with at least one of lanthanum, calcium, strontium, and silicon. Doping a PZT film with these elements corrects the fatigue, and improves imprint characteristics, of the second ferroelectric film 24c, and can lower a write voltage and a read voltage for a capacitor.

Alternatively, the second ferroelectric film 24c may be formed of a Bi layered compound such as $(Bi_{1-x}R_x)Ti_3O_{12}$ (R is a rare-earth element, and 0<x<1), $SrBi_2Ta_2O_9$, or $SrBi_4Ti_4O_{15}$.

Furthermore, the method of depositing the second ferroelectric film 24c is not limited to sputtering. The second ferroelectric film 24c may be formed by the sol-gel method or MOCVD. In the case where MOCVD is employed, conditions similar to those for the first ferroelectric film 24b can be employed as deposition conditions for the second ferroelectric film 24c.

However, it should be noted that, for an undermentioned reason, the second ferroelectric film 24c is preferably an amorphous film or a film made of microcrystals. It is most preferable to employ sputtering by which the second ferroelectric film 24c which is amorphous can be deposited.

Subsequently, as shown in FIG. 1K, while the silicon substrate 1 is being heated, an iridium oxide ($IrO_x$) film is formed as a first metal oxide film 25d on the ferroelectric film 24. The iridium oxide film is formed to have a thickness of approximately 50 nm by sputtering. Note that the iridium oxide film formed by sputtering, in which the silicon substrate 1 is heated as described above, has already been crystallized at the time of deposition even when a process for crystallization is not performed.

Deposition conditions for the first metal oxide film 25d are not particularly limited. In this embodiment, the substrate temperature is set at 300° C., a gas mixture of oxygen having a flow rate of 140 sccm and an argon gas having a flow rate of 60 sccm is used as a sputtering gas. The sputtering power is set to be 1 kW to 2 kW.

At this time, the first ferroelectric film 24b suffers from damage due to the sputtering gas when the second ferroelectric film 24c and the first metal oxide film 25d are formed by sputtering. In addition, by such sputtering gas, the concentration of oxygen in the first ferroelectric film 24b is made insufficient, and ferroelectric characteristics thereof may be deteriorated.

Accordingly, by performing RTA in a mixed atmosphere of argon and oxygen after the formation of the above-described first metal oxide film 25d, the damage to the first ferroelectric film 24b due to sputtering is recovered, and oxygen deficiency in the first ferroelectric film 24b is compensated.

Conditions for this RTA are not particularly limited. It should be noted, however, that the substrate temperature is preferably higher than that of the annealing (FIG. 1I) of the first ferroelectric film 24b, and that the substrate temperature is preferably set at a temperature of not lower than 650° C., more preferably 700° C. to 750° C. In this embodiment, the substrate temperature is set at 725° C.

As for the concentration of oxygen in the annealing atmosphere, the flow rate ratio thereof is preferably set to be 0.1 to 50%. In this embodiment, the flow rates of argon and oxygen are set at 2000 sccm and at 20 sccm, respectively. Moreover, the treatment time is set to be 60 seconds.

Here, since the first metal oxide film 25d is crystallized at the time of deposition, unevenness is formed at the interface between the first metal oxide film 25d and the second ferroelectric film 24c, reflecting the existence of crystal grains in the first metal oxide film 25d. This RTA also provides the advantage that such unevenness is planarized.

Furthermore, since the second ferroelectric film 24c is formed to be amorphous, iridium atoms, which diffuse into the ferroelectric film 24 from the first metal oxide film 25d due to the RTA, remain in the second ferroelectric film 24c, and are less prone to reach the first ferroelectric film 24b. As a result, iridium is less prone to diffuse into grain boundaries of the first ferroelectric film 24 which is crystallized to show excellent ferroelectric characteristics. Accordingly, leakage paths are prevented from being formed by the iridium, and it is made possible to effectively prevent the leakage current of a ferroelectric capacitor.

The above-described advantages can also be obtained when the second ferroelectric film 24c is formed of a film made of microcrystals.

Next, an iridium oxide film is formed as a second metal oxide film 25e on the first metal oxide film 25d. The iridium oxide film is formed to have a thickness of approximately 100 to 300 nm, e.g., 200 nm, by sputtering in which the substrate temperature is set at room temperature. The second metal oxide film 25e is formed in an argon atmosphere at a pressure of 0.8 Pa by setting the sputtering power at 1.0 kW and the deposition time to be 79 seconds.

Here, unlike the first metal oxide film 25d crystallized at a high deposition temperature, the second metal oxide film 25e formed by sputtering, in which the substrate temperature is set at room temperature, is made amorphous.

In the above-described sputtering for iridium oxide, iridium atoms, which fly from an iridium target, are oxidized in the sputtering atmosphere to be deposited on the substrate. Accordingly, some of the deposited iridium oxide is not sufficiently oxidized in the atmosphere. Therefore, the iridium oxide film is, as a whole, prone to be in a state in which the amount of oxygen therein is smaller than that in the stoichiometric composition ($IrO_2$).

However, when the amount of oxygen is insufficient in the second metal oxide film 25e, the catalysis of the second metal oxide film 25e is accelerated. Accordingly, when external water is brought into contact with the second metal oxide film 25e, hydrogen is generated from the second metal oxide film 25e. Since hydrogen causes a problem of reducing the ferroelectric film 24 to deteriorate ferroelectric characteristics thereof, the amount of hydrogen generated needs to be made as small as possible in a process of manufacturing an FeRAM.

Accordingly, from the viewpoint of preventing the generation of hydrogen, the amount of oxygen contained in the second metal oxide film 25e is preferably larger than the amount of oxygen contained in the first metal oxide film 25d.

Thus, in this embodiment, by supplying oxygen as much as possible at the time of depositing the second metal oxide film 25e, the composition of iridium oxide is brought close to the stoichiometric composition ($IrO_2$) to inhibit the catalysis of the second metal oxide film 24e.

The second metal oxide film 25e and the first metal oxide film 25d as described above together form a metal oxide film 25b as shown in FIG. 1K.

A material for the first and second metal oxide films 25d and 25e is not limited to iridium oxide. The first and second metal oxide films 25d and 25e can be formed of oxide of any of iridium (Ir), ruthenium (Ru), rhodium (Rh), rhenium (Re), osmium (Os), and palladium (Pd). Furthermore, such oxides may be stacked to be used as the metal oxide film 25b.

Subsequently, an iridium film is formed as a conductivity-improving film 25c on the metal oxide film 25b. The conductivity-improving film 25c is formed to have a thickness of approximately 100 nm by sputtering which is performed in an argon atmosphere at a pressure of 1 Pa and with a sputtering power of 1.0 kW introduced into the sputtering atmosphere.

The conductivity-improving film 25c and the metal oxide film 25b thereunder together constitute a second conductive film 25. The conductivity-improving film 25c has a role of compensating the conductivity of the second conductive film 25, which is prone to be insufficient in the case where only the metal oxide film 25b is used. Because iridium, which is a material for the conductivity-improving film 25c, has excellent barrier properties against hydrogen, the conductivity-improving film 25c also has a role of blocking external hydrogen and of preventing a deterioration of the ferroelectric film 24

Instead of the iridium film, a platinum film or a $SrRuO_3$ film may be formed as the conductivity-improving film 25c.

Thereafter, the back surface of the silicon substrate 1 is cleaned.

Next, as shown in FIG. 1L, a titanium nitride film is formed on the second conductive film 25 by sputtering. The titanium nitride film is used as a first mask material layer 26.

Furthermore, a silicon oxide film is formed as a second mask material layer 27 on the first mask material layer 26 by plasma CVD using a TEOS gas.

Thereafter, as shown in FIG. 1M, the second mask material layer 27 is patterned into island-shape, thereby forming second hard masks 27a.

Next, steps for obtaining the cross-sectional structure shown in FIG. 1N will be described.

First, the first mask material layer 26 is etched using the second hard mask 27a as a mask to form a first hard mask 26a.

Subsequently, portions of the second conductive film 25, the ferroelectric film 24, and the first conductive film 23, which are not covered with the first and second hard masks 26a and 27a, are dry-etched. Thereby, capacitors Q, each of which includes a lower electrode 25a, a capacitor dielectric film 24a, and an upper electrode 23a, are formed.

Gas used in the dry etching is not particularly limited. However, a gas mixture of HBr and oxygen is used as an etching gas for the first and second conductive films 23 and 25, and a gas mixture of chlorine and argon is used as an etching gas for the ferroelectric film 24.

Since the conductive oxygen barrier film 22 has etching resistance to the etching gas for the first conductive film 23, the conductive oxygen barrier film 22 is left on the entire surface of the underlying conductive film 21 even after the capacitors Q are formed.

The capacitors Q formed as described above are electrically connected to the first conductive plugs 32a through the conductive oxygen barrier film 22, the underlying conductive film 21, and the third conductive plugs 36a.

Subsequently, as shown in FIG. 1O, the second hard mask 27a made of silicon oxide is removed by wet etching using a mixed solution of hydrogen peroxide ($H_2O_2$), ammonia, and water as an etchant. Incidentally, the second hard mask 27a may be removed by dry etching.

Next, steps for obtaining the cross-sectional structure shown in FIG. 1P will be described.

First, using the first hard mask 26a as a mask, the underlying conductive film 21 and the conductive oxygen barrier film 22 are etched to leave these films only under the capacitors Q. This etching is performed by dry etching. As an etching gas therefor, for example, a gas mixture of argon and chlorine is used.

The first hard mask 26a is also etched by this etching gas. Accordingly, when the etching is finished, the first hard mask 26a is removed, and the upper surfaces of the upper electrodes 25a are exposed.

Subsequently, as shown in FIG. 1Q, an alumina ($Al_2O_3$) film for covering the capacitors Q is formed to have a thickness of approximately 20 nm. The alumina film is used as a first capacitor protection insulating film 39. Alumina constituting the first capacitor protection insulating film 39 has an excellent ability to prevent the permeation of hydrogen. Accordingly, external hydrogen is blocked with the first capacitor protection insulating film 39. Thus, the capacitor dielectric films 24a can be prevented from being deteriorated by hydrogen.

At this time, the capacitor dielectric films 24a suffer from damage due to the dry etching (see FIG. 1O) performed at the time of the formation of the capacitors Q and due to the deposition of the first capacitor protection insulating film 39 by sputtering.

Accordingly, in order to cause the capacitor dielectric films 24a to recover from this damage, recovery annealing is performed on the capacitor dielectric films 24a in an oxygen-containing atmosphere as shown in FIG. 1R. Conditions for this recovery annealing are not particularly limited. In this embodiment, the substrate temperature is set at 550° C. to 700° C., e.g., 650° C., in a furnace, and the recovery annealing is performed for approximately 60 minutes.

Subsequently, as shown in FIG. 1S, an alumina film is formed on the first capacitor protection insulating film 39. This alumina film is formed to have a thickness of approximately 20 nm by use of CVD, and is used as a second capacitor protection insulating film 40.

Next, steps for obtaining the cross-sectional structure shown in FIG. 1T will be described.

First, a silicon oxide film is formed as a second interlayer insulating film 41 on the second capacitor protection insulating film 40 by plasma CVD using a TEOS gas as a reaction gas. In the reaction gas, an oxygen gas and a helium gas are also contained. The thickness of the second interlayer insulating film 41 is not particularly limited. In this embodiment, the thickness thereof on the flat surface of the silicon substrate 1 is set at 1500 nm.

Instead of the silicon oxide film, an insulating inorganic film may be formed as the second interlayer insulating film 41.

Thereafter, the surface of the second interlayer insulating film 41 is polished and planarized by CMP.

Furthermore, as a dehydrating treatment for the second interlayer insulating film 41, the surface of the second interlayer insulating film 41 is exposed to a $N_2O$ plasma. This $N_2O$ plasma removes water remaining in the second interlayer insulating film 41, and prevents water from being absorbed back into the second interlayer insulating film 41.

Note that $N_2$ plasma treatment may be performed as this dehydrating treatment.

Subsequently, a flat alumina film is formed on the second interlayer insulating film 41. The flat alumina film is formed to have a thickness of approximately 20 nm to 30 nm by use of sputtering, and is used as a third capacitor protection insulating film 42. This third capacitor protection insulating film 42 is formed on the second interlayer insulating film 41 which is planarized. Accordingly, excellent coverage characteristics are not needed for the third capacitor protection insulating film 42, which is therefore formed by inexpensive sputtering as described above. However, a method of depositing the third capacitor protection insulating film 42 is not limited to sputtering, and may be CVD.

Thereafter, as shown in FIG. 1U, a silicon oxide film is formed as a cap insulating film 43 on the third capacitor protection insulating film 42. The cap insulating film 43 is formed to have a thickness of approximately 300 nm by plasma CVD using a TEOS gas. Here, a silicon oxynitride film or a silicon nitride film may be formed as the cap insulating film 43.

Next, steps for obtaining the cross-sectional structure shown in FIG. 1V will be described.

First, the first to third capacitor protection insulating films 39, 40, and 42, the second interlayer insulating film 41, and the cap insulating film 43 are patterned. Thereby, second holes 41a are formed in these films on the upper electrodes 25a.

Then, in order to recover damage to the capacitor dielectric films 24a caused in the foregoing steps, the silicon substrate 1 is placed in an unillustrated furnace, and recovery annealing in which the substrate temperature is set at 550° C., is performed in an oxygen atmosphere for approximately 40 minutes.

Subsequently, the first to third capacitor protection insulating films 39, 40, 42, the second interlayer insulating film 41, the cap insulating film 43, the underlying insulating film 15, and the anti-oxidation insulating film 14, which are on the second conductive plugs 32b, are patterned. Thereby, a third hole 41b is formed in these films.

When this patterning is performed, the second holes 41a are covered with a resist pattern, and are protected from the etching atmosphere by the resist pattern.

Here, when an attempt is made to simultaneously form these holes 41a and 41b, the upper electrodes 25a in the second holes 41a are exposed to the etching atmosphere for a long time until the deep third hole 41b is formed. As a result, there arises a problem that the capacitor dielectric films 24a deteriorate.

In this embodiment, the second and third holes 41a and 41b respectively having different depths are separately formed as described previously. Accordingly, such a problem can be avoided.

Furthermore, the second conductive plug 32b over the second source/drain region 8b is covered with the anti-oxidation insulating film 14 until the present step is finished. Accordingly, tungsten constituting the second conductive plug 32b is prevented from being oxidized and from causing a contact failure.

Subsequently, by use of sputtering, a titanium film and a titanium nitride film are formed, together as a glue film, in this order on the cap insulating film 43 and in the second and third holes 41a and 41b.

Incidentally, the titanium nitride film may be formed by MOCVD. In this case, in order to remove carbon from the titanium nitride film, it is preferable that the titanium nitride film be annealed in an atmosphere made by converting nitrogen and hydrogen into a plasma. Even when annealing is performed in a hydrogen-containing atmosphere in this way, the conductivity-improving films 25c (see FIG. 1K) which is made of iridium, and which is formed in the uppermost layer of the upper electrodes 25a, block hydrogen. Thus, the metal oxide films 25b are not reduced by hydrogen.

Moreover, a tungsten film is formed on the glue film by CVD. Thereby, the second and third holes 41a and 41b are completely buried with this tungsten film.

Thereafter, unnecessary portions of the glue film and the tungsten film on the cap insulating film 43 are polished and removed by CMP to leave these films only in the second and third holes 41a and 41b respectively as fourth and fifth conductive plugs 47a and 47b.

Of these plugs, the fourth conductive plugs 47a are electrically connected to the upper electrodes 25a of the capacitors Q. On the other hand, the fifth conductive plug 47b is electrically connected to the second conductive plug 32b, and constitutes part of a bit line together with the second conductive plug 32b.

Thereafter, as shown in FIG. 1W, stacked metal films are formed on the cap insulating film 43 and the conductive plugs 47a and 47b by sputtering. This stacked metal films are then patterned into metal interconnections 49a and a conductive pad 49b used for the bit line.

As the stacked metal films, a titanium film having a thickness of 60 nm, a titanium nitride film having a thickness of 30 nm, a copper-containing aluminum film having a thickness of 360 nm, a titanium film having a thickness of 5 nm, and a titanium nitride film having a thickness of 70 nm are formed in this order.

By the above-described steps, the basic structure of the semiconductor device according to the first embodiment is completed.

Figure 2:
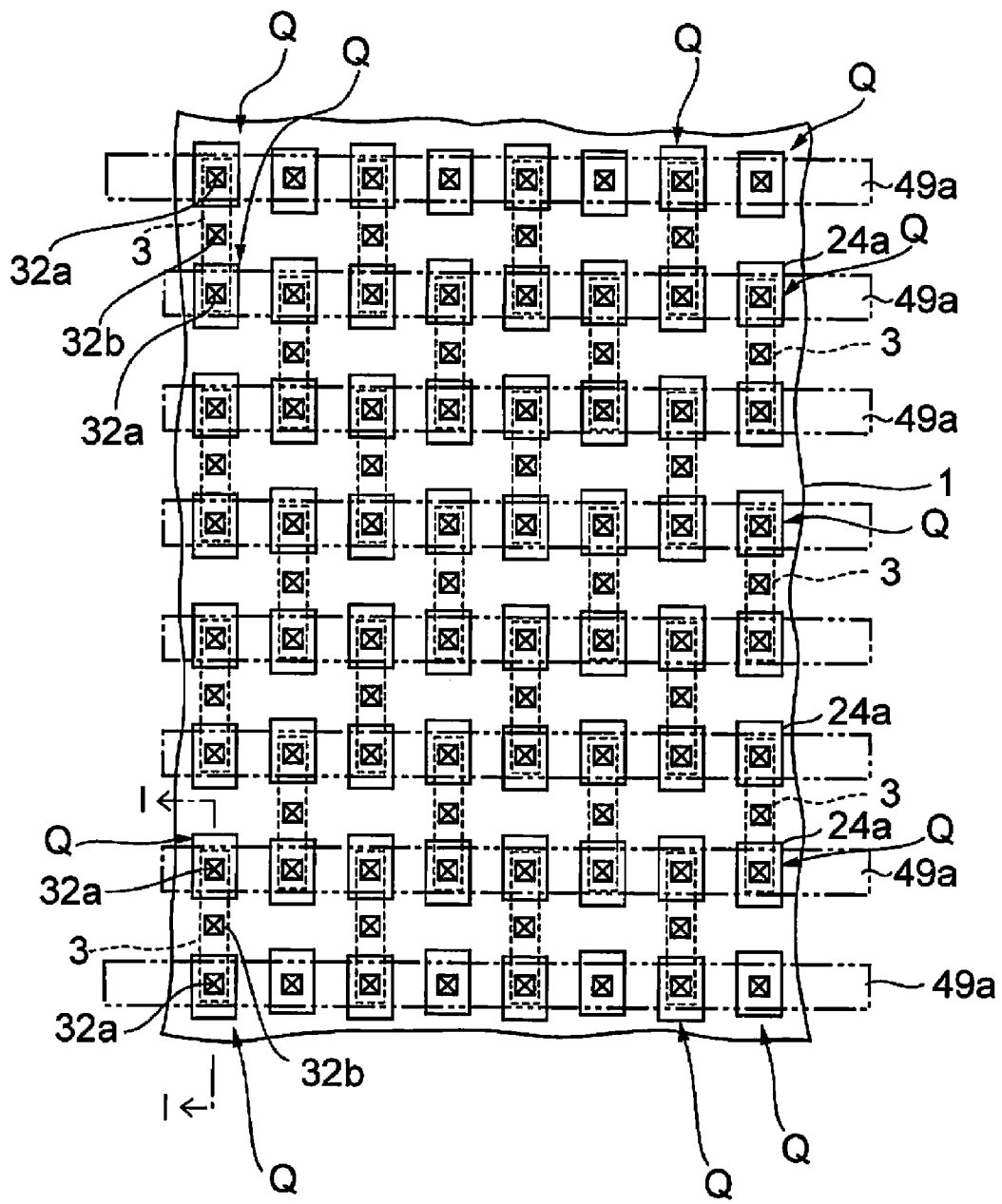
FIG. 2 is an enlarged plan view of a cell region of the semiconductor device according to the first embodiment of the present invention.

FIG. 2 is an enlarged plan view of a cell region of this semiconductor device. The view shown in aforementioned FIG. 1W corresponds to a cross-sectional view taken along line I-I of FIG. 2.

As shown in FIG. 2, a plurality of capacitors Q are formed in the form of an array in the cell region.

In the first embodiment described above, as shown in FIG. 1I, the first ferroelectric film 24b formed by MOCVD is annealed in an atmosphere containing an oxidizing gas to expel impurities in the first ferroelectric film 24b to the outside of the film.

Advantages obtained by such annealing will be described below.

Figure 3:
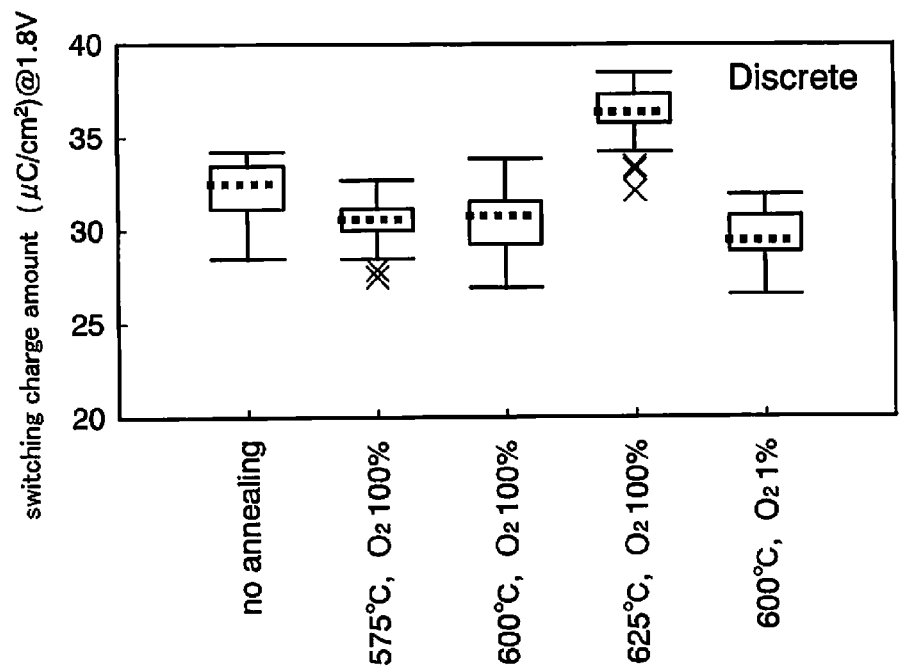
FIG. 3 is a graph obtained by studying a relationship between annealing conditions and switching charge amounts of capacitors in the first embodiment of the present invention.

FIG. 3 is a view obtained by studying the relationship between annealing conditions and the switching charge amounts of capacitors.

In this study, a PZT film having a thickness of 100 nm was formed by MOCVD as the first ferroelectric film 24b.

Annealing conditions were the following five sets of conditions: (i) no annealing; (ii) a substrate temperature of 575° C., an oxygen concentration of 100%, and a treatment time of 60 seconds; (iii) a substrate temperature of 600° C., an oxygen concentration of 100%, and a treatment time of 60 seconds; (iv) a substrate temperature of 625° C., an oxygen concentration of 100%, and a treatment time of 60 seconds; and (v) a substrate temperature of 600° C., an oxygen concentration of 1%, and a treatment time of 60 seconds.

Moreover, after annealing was performed under each set of conditions, an amorphous CSPLZT film was formed as the second ferroelectric film 24c to have a thickness of 20 nm, and the steps to the formation of the metal interconnections 49a were performed according to the first embodiment.

In the study shown in FIG. 3, under the above conditions, 56 capacitors whose planar shapes were 50 μm×50 μm squares, were fabricated on the silicon substrate 1 to be isolated from one another.

Thereafter, the applied voltage was set at 1.8 V, and the switching charge amount Qsw of each capacitor was measured. It should be noted that a dotted line for each set of annealing conditions indicates the average of the switching charge amounts Qsw of the 56 capacitors, and that the lines at the upper and lower ends respectively represent the maximum and minimum of Qsw.

As shown in FIG. 3, in the case where capacitors are formed to be isolated from one another as described above, the switching charge amounts Qsw slightly decreased under conditions in which the substrate temperature was 575° C. to 600° C.

On the other hand, under conditions in which the substrate temperature was 625° C., the switching charge amounts Qsw was high. The reason is considered to be that, when annealing is performed at a higher temperature, impurities, such as water and carbon, contained in the first ferroelectric film 24b are expelled outside the film by the annealing.

Figure 4:
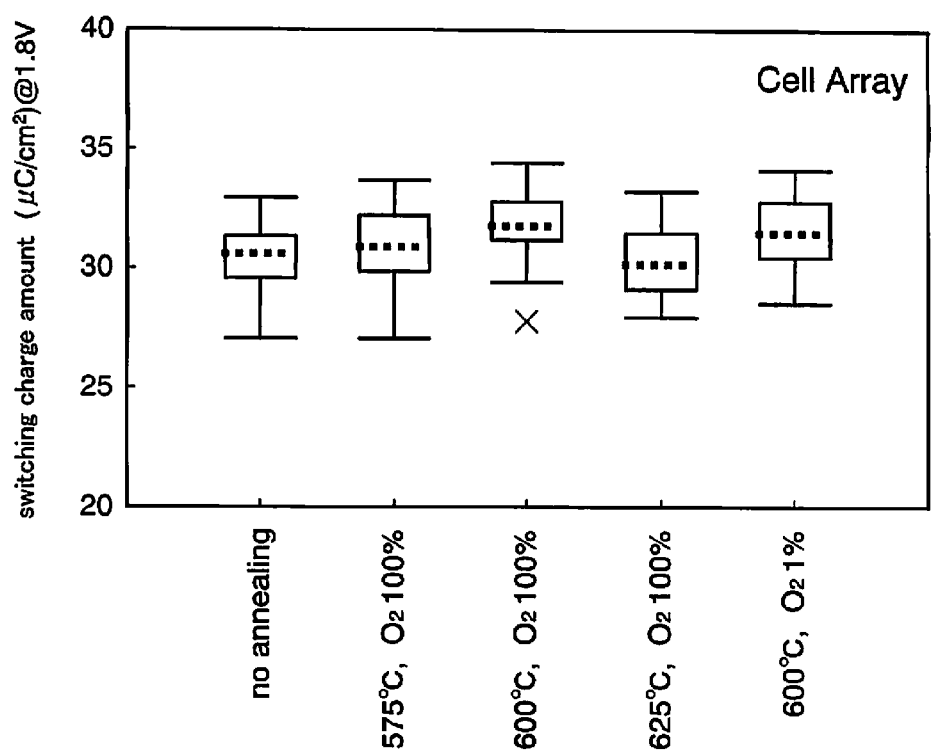
FIG. 4 is a graph obtained by performing the study, which is the same as in FIG. 3, on 56 cell regions each formed to have 5152 capacitors which are identical to those for the case of FIG. 3, and which are densely formed.

On the other hand, FIG. 4 is a graph obtained by performing the study, which is the same as that in FIG. 3, on 56 cell regions each formed to have 5152 capacitors which are identical to those in the case of FIG. 3, and which are densely formed. In each cell region, a plurality of capacitors Q is formed in the form of an array as shown in FIG. 2.

As shown in FIG. 4, in the case where a plurality of capacitors Q are formed in the form of an array, even under conditions in which the substrate temperature is 575° C., the switching charge amounts Qsw increase compared to those in the case where annealing was not performed. This tendency of the increase in the switching change amounts Qsw continues to the conditions in which the substrate temperature is 600° C.

On the other hand, under conditions in which the substrate temperature is 625° C., the switching charge amounts Qsw decrease. The reason is considered to be that lead essential in maintaining ferroelectric characteristics escapes from the first ferroelectric film 24b due to annealing. In contrast to this, in the case where capacitors are formed to be isolated from each other as in FIG. 3, the reason for an increase in the switching charge amounts Qsw at the substrate temperature of 625° C. is considered to be that lead hardly escapes from the first ferroelectric film 24b of the isolated capacitors, and that the impurity removing effect of annealing is larger.

Figure 5:
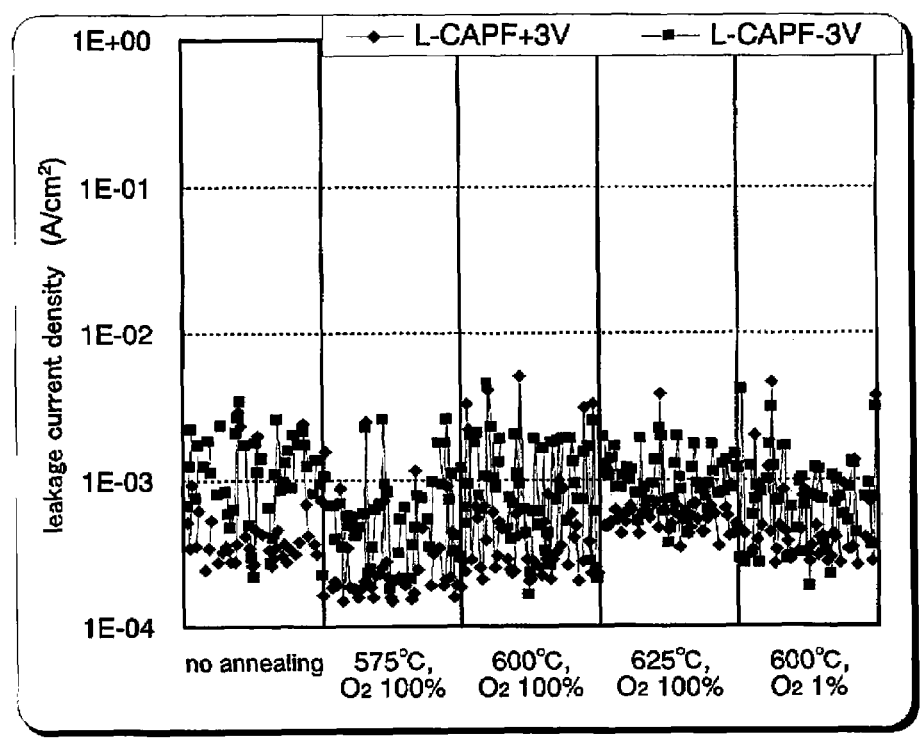
FIG. 5 is a graph obtained by studying leakage current densities of the capacitors used in the study of FIG. 3.
Figure 6:
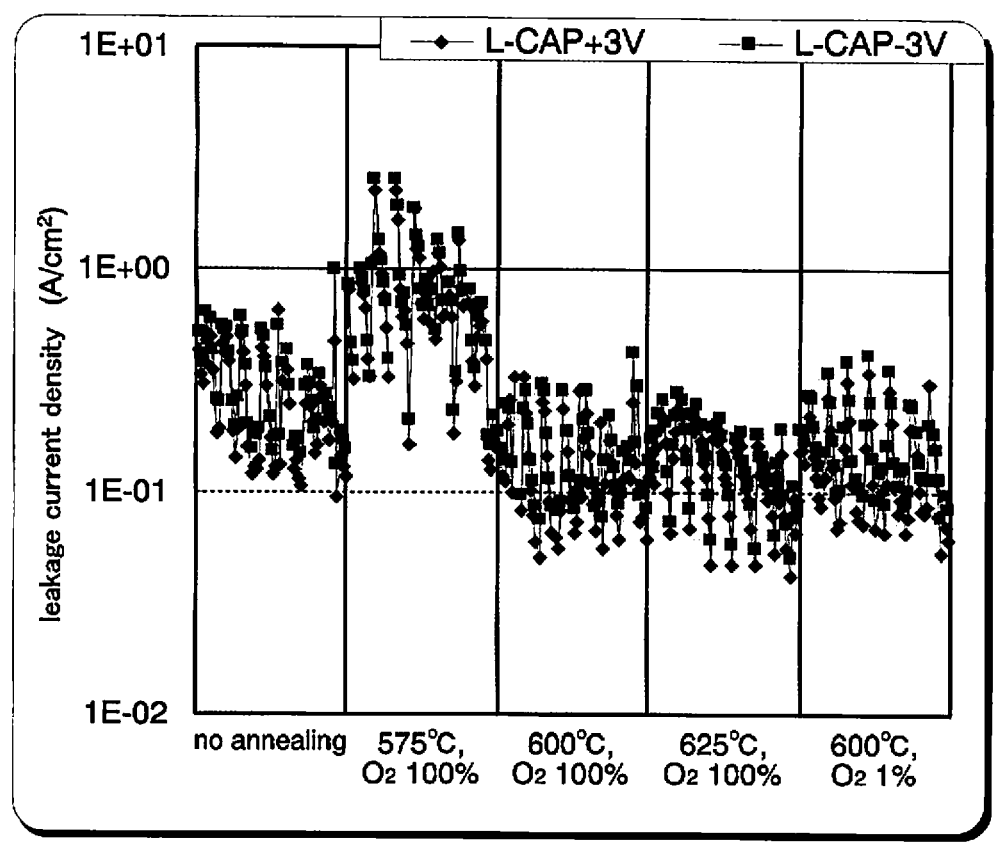
FIG. 6 is a graph obtained by studying the leakage current densities of the capacitors used in the study of FIG. 4.

Next, the results of studying the leakage current densities of the capacitors of FIGS. 3 and 4 are shown in FIGS. 5 and 6, respectively.

FIG. 5 is a view showing a relationship between the annealing conditions and the leakage current densities in a case where capacitors are formed to be isolated from one another as those in FIG. 3. Incidentally, annealing conditions are the same as in FIG. 3. "L-CAPF+3V" and "L-CAPF-3V" in FIG. 5 respectively indicate that voltages of +3 V and -3 V were applied to the upper electrode 25a while using the lower electrode 23a as a reference.

As shown in FIG. 5, when capacitors are formed to be isolated from one another, leakage currents do not greatly differ between the case where annealing is performed and the case where annealing is not performed.

On the other hand, FIG. 6 is a view showing a relationship between the annealing conditions and leakage current densities in the case where a plurality of capacitors are formed in the form of an array as in FIG. 4. Annealing conditions are the same as those in FIG. 3. "L-CAP+3V" and "L-CAP-3V" in FIG. 6 respectively indicate that voltages of +3 V and −3 V were applied to the upper electrode 25a while using the lower electrode 23a as a reference.

As shown in FIG. 6, when capacitors are formed in the form of an array, under conditions in which the substrate temperature is 600° C. to 625° C., leakage currents can be made approximately 0.5 orders of magnitude smaller than those in the case where annealing is not performed. The reason is considered to be that impurities, such as water and carbon absorbed by the first ferroelectric film 24b, are expelled outside the film by annealing, and that leakage paths in the first ferroelectric film 24b are reduced.

Moreover, the inventor of the present application studied the fatigue of capacitors densely formed in the form of an array as described previously.

Figure 7:
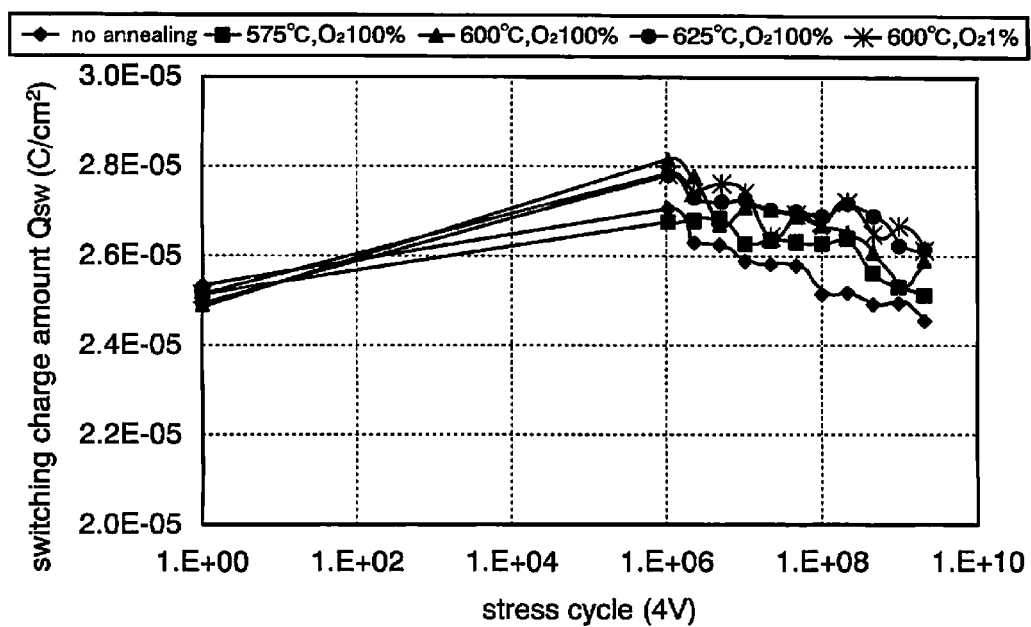
FIG. 7 is a graph obtained by studying a relationship between stress cycles and switching charge amounts in the first embodiment of the present invention.

FIG. 7 is a graph showing a relationship between stress cycles and switching charge amounts, the relationship being used as basic data for calculating the fatigue. Here, a pulsed voltage having a maximum voltage of +4 V and a minimum voltage of −4 V was applied to the upper electrode 25a. The stress cycle in FIG. 7 is the number of pulses applied as described above. A reference voltage is the potential of the lower electrode 23a.

As shown in FIG. 7, the switching charge amounts Qsw gradually decrease after reaching the maximum at approximately $10^6$ stress cycles under any annealing conditions.

In this study, an accelerated experiment is performed at a voltage (4V) higher than in actual use. Accordingly, in an actual product, the degree of a decrease in the switching charge amount Qsw is more gradual than that in FIG. 7. Thus, it is made possible to ensure the switching charge amount Qsw which can withstand actual use even after approximately $10^{10}$ stress cycles.

Figure 8:
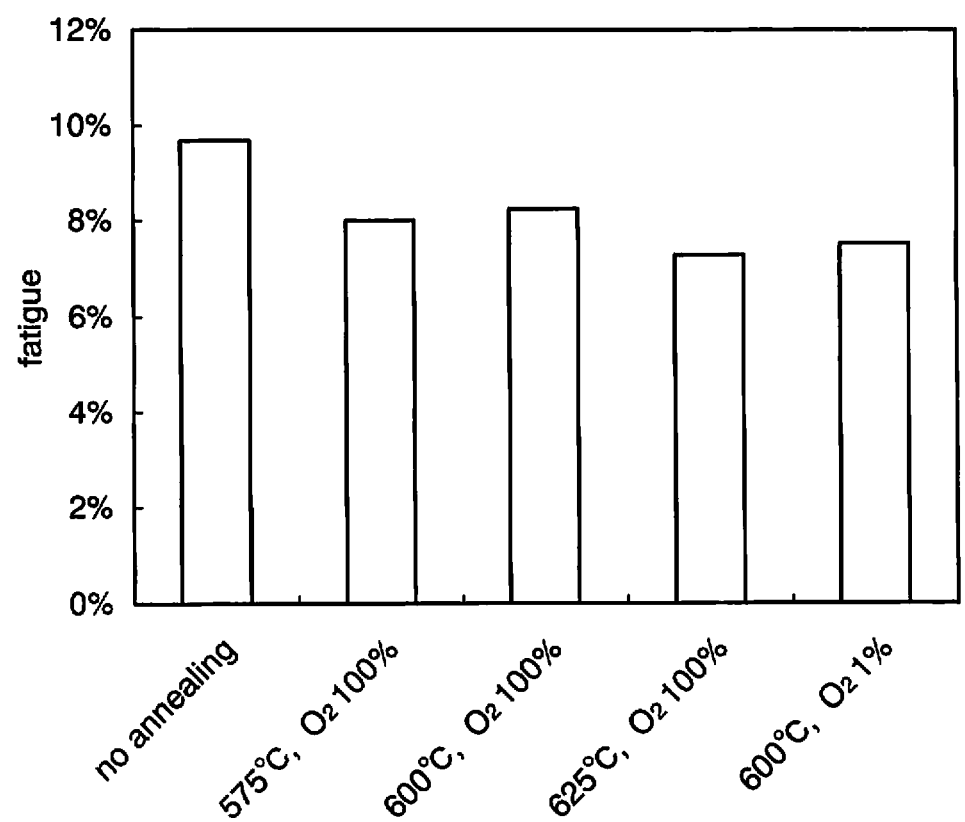
FIG. 8 is a graph showing fatigue after $1.0 \times 10^9$ cycles in the first embodiment of the present invention.

FIG. 8 is a graph showing fatigue after $2.0 \times 10^9$ cycles which is obtained on the basis of the result shown in FIG. 7. It should be noted that the fatigue is defined as follows:

Fatigue=100×(Max(Qsw)−Qsw(after 1.0×10$^9$ cycles))/Max(Qsw)

Note that Max(Qsw) is the maximum of each line of the graph in FIG. 7.

As shown in FIG. 8, under any annealing conditions, the fatigue can be decreased by approximately 2% compared to that in the case where annealing is not performed. The reason is considered to be that impurities contained in the first ferroelectric film 24b are reduced by annealing.

Next, imprint characteristics of the above-described capacitors will be described.

Figure 9:
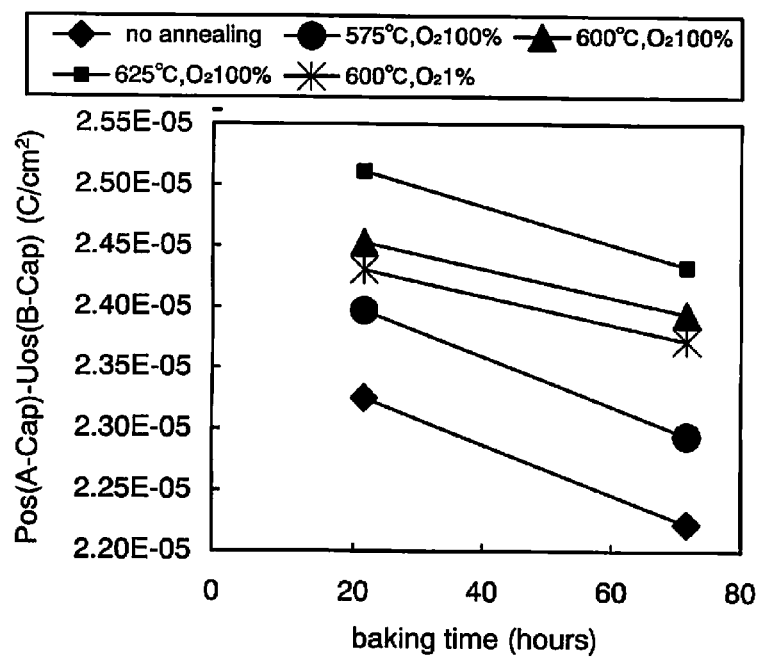
FIG. 9 is a graph obtained by studying imprint characteristics in the first embodiment of the present invention.
Figure 9:
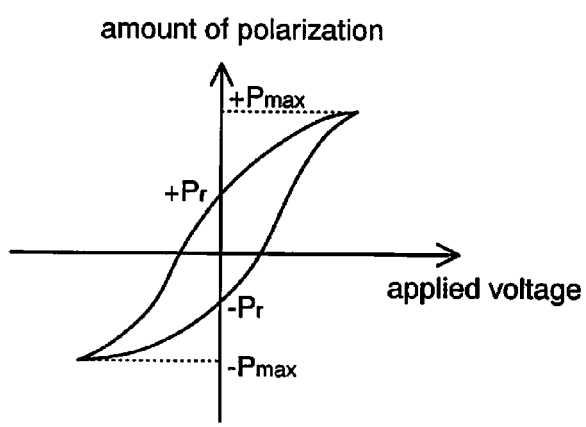

FIG. 9 is a graph obtained by studying imprint characteristics.

In this study, the value of Pos(A-Cap)−Uos(B-Cap) was employed as imprint characteristics. Note that A-Cap and B-Cap respectively represent two adjacent capacitors (A-Capacitor and B-Capacitor). Pos(A-Cap) is the P-term of the A-Capacitor in an opposite state (OS) read, and Uos(B-Cap) is the U-term of the B-Capacitor in an OS read. Using the remanent polarization charge amount Pr and the maximum polarization amount Pmax of the ferroelectric, the P-term and the U-term are defined by Pos(A-Cap)=Pmax+Pr and Uos(B-Cap)=Pmax−Pr, respectively. Incidentally, the maximum polarization amount Pmax is the amount of polarization of the capacitor dielectric film at the time when a write voltage is applied to the capacitor. Generally, Pos(A-Cap)−Uos(B-Cap) is approximately equal to the switching charge amount Qsw of the ferroelectric.

This imprint characteristic is measured as follows.

(i) A positive direction write is performed on the A-Capacitor, and a negative direction write is performed on the B-Capacitor. Thereby, the remanent polarization charge amount of the A-Capacitor becomes +Pr, and that of the B-Capacitor becomes −Pr.

Incidentally, when +4 V and −4 V are respectively represented by "+" and "−," a pulse voltage used to write to the A-Capacitor is "++++" which indicates that +4 V are applied four times consecutively. On the other hand, writing to the B-Capacitor is "− − − −" which indicates −4 V are applied consecutively.

(ii) The A-Capacitor and the B-Capacitor are baked for 24 hours.

(iii) A same state (SS) read is performed on the A-Capacitor. This read operation changes the amount of polarization of the A-Capacitor from +Pr to +Pmax and further to +Pr. The read value corresponds to Uss(A-Cap). Incidentally, a pulse voltage used in this read is "++++."

(iv) An SS read is performed on the B-Capacitor. This read operation changes the amount of polarization of the B-Capacitor from −Pr to −Pmax and further to +Pr. The read value corresponds to Pss(B-Cap). Concurrently, writing to the B-Capacitor is performed using a pulse voltage represented by "++− −." A This changes the amount of polarization of the B-Capacitor from +Pr to −Pmax and further to −Pr.

(v) An OS write is performed on the A-Capacitor and the B-Capacitor. This changes the amount of polarization of the A-Capacitor from +Pr to −Pr and the amount of polarization of the B-Capacitor from −Pr to +Pr. Incidentally, a pulse voltage represented by "− − − −" is used to write to the A-Capacitor, and a pulse voltage represented by "++++" is used to write to the B-Capacitor.

(vi) The A-Capacitor and the B-Capacitor are baked at 90° C. for 20 minutes.

(vii) An OS read is performed on the A-capacitor using a pulse voltage represented by "++− −". This read operation changes the amount of polarization of the A-Capacitor from −Pr to −Pmax and further to +Pr. The read value corresponds to Pos(A-Cap). Thereafter, an inverted pulse is applied to the A-Capacitor to change the amount of polarization of the A-Capacitor from +Pr to −Pr.

(viii) An OS read is performed on the B-Capacitor using a pulse voltage represented by "++++." This read operation changes the amount of polarization of the B-Capacitor from +Pr to +Pmax and further to +Pr. The read value corresponds to Uos(B-Cap).

(ix) Pos(A-Cap)−Uos(B-Cap) is calculated.

Thereafter, steps of (i) to (viii) are repeated again. At this time, the baking temperature in step (ii) is set at 150° C.

In FIG. 9, the baking time indicated on the horizontal axis represents the baking time in step (ii) for the second round.

The larger value of Pos(A-Cap)−Uos(B-Cap) is more favorable. This is because imprint characteristics of the capacitors are favorable, and because the margin of the device increases.

It is apparent from FIG. 9 that, in the case where annealing is performed on the first ferroelectric film 24b as in the first embodiment, the value of Pos(A-Cap)−Uos(B-Cap) is larger than that in the case where annealing is not performed on the first ferroelectric film 24b, and imprint characteristics are made favorable.

Figure 10:
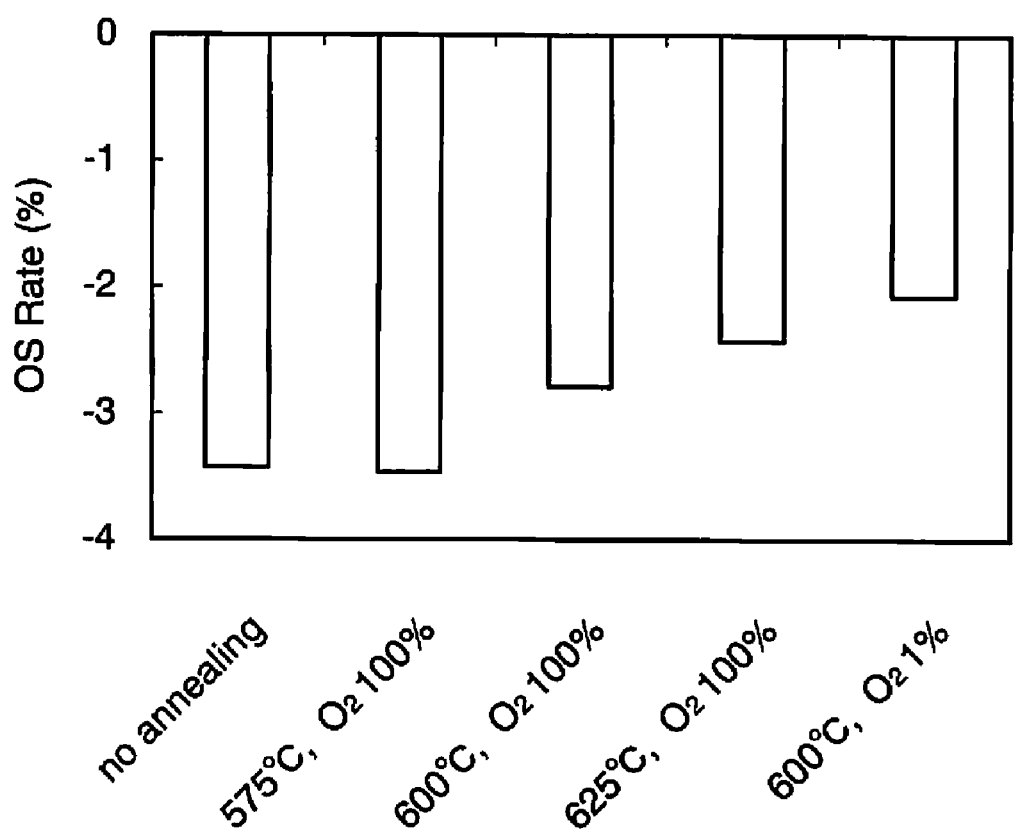
FIG. 10 is a graph obtained by studying OS-Rates in the first embodiment of the present invention.

FIG. 10 is a graph obtained by calculating a logarithmic approximation of Pos(A-Cap)−Uos(B-Cap) in the case where the baking time is 72 hours in FIG. 9. Each value of the graph is called an OS-Rate. The closer the OS-Rate is to zero, the smaller a deterioration in the capacitors is.

As shown in FIG. 10, when annealing is performed on the first ferroelectric film 24b as in the first embodiment, the OS-Rate is improved by approximately 1% compared to that in the case where annealing is not performed on the first ferroelectric film 24b.

Thus, according to the first embodiment, by annealing the first ferroelectric film 24b in an atmosphere containing an oxidizing gas, it is made possible to simultaneously achieve an increase in the switching charge (FIG. 4), a decrease in the leakage current (FIG. 6), a decrease in the fatigue (FIG. 8), and an improvement in imprint characteristics (FIGS. 9 and 10).

(2) Second Embodiment

FIGS. 11A to 11L are cross-sectional views of a semiconductor device according to a second embodiment of the present invention in the process of being manufactured. Incidentally, in these drawings, elements described in the first embodiment are denoted by the same reference numerals as in the first embodiment, and will not be further described below.

In the step of FIG. 1C of the first embodiment, the third conductive plugs 36a are formed by polishing the glue film 35 and the plug conductive film 36 by CMP.

However, for the slurry used in the CMP, the polishing speeds of the glue film 35 and the plug conductive film 36 are faster than that of the underlying insulating film 15 thereunder. It is therefore difficult to align the heights of the respective upper surfaces of the third conductive plugs 36a and the underlying insulating film 15 with each other at the time when the CMP is finished.

Figure 11A:
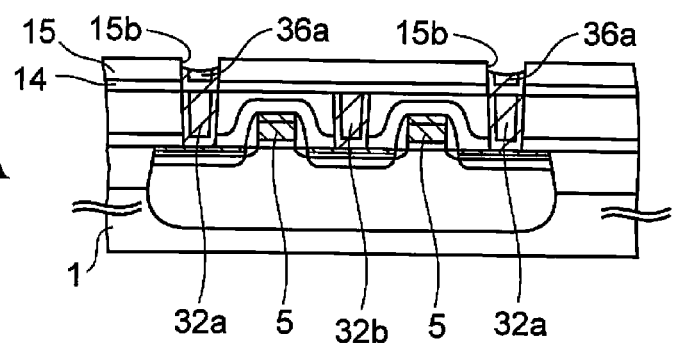
FIGS. 11A to 11L are cross-sectional views of a semiconductor device according to a second embodiment of the present invention, the semiconductor device being in a process of being manufactured.

Accordingly, as shown in FIG. 11A, recesses 15b are actually formed in the underlying insulating film 15 after the above-described CMP, and the heights of the upper surfaces of the third conductive films 36a are made lower than that of the second insulating film. The depths of the recesses 15b are 20 to 50 nm, typically approximately 50 nm.

However, when such recesses 15b exist, the orientation of lower electrodes and capacitor dielectric films is disturbed, and there arises a problem that ferroelectric characteristics of the capacitor dielectric films deteriorate.

To solve this problem, in the second embodiment, the following steps are performed.

Figure 11B:
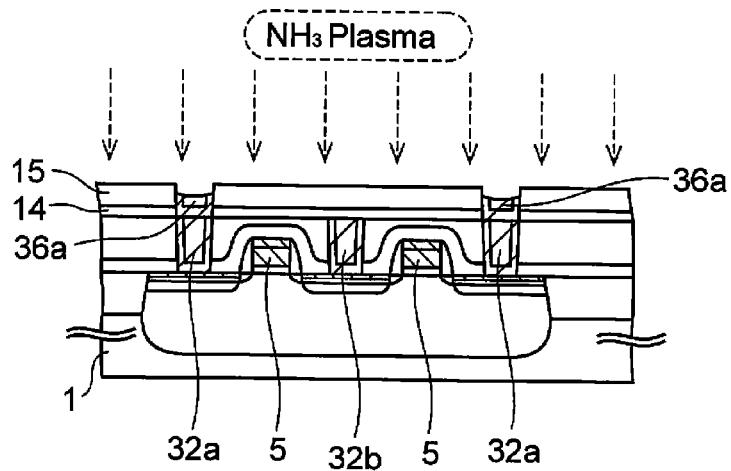
Figure 11C:
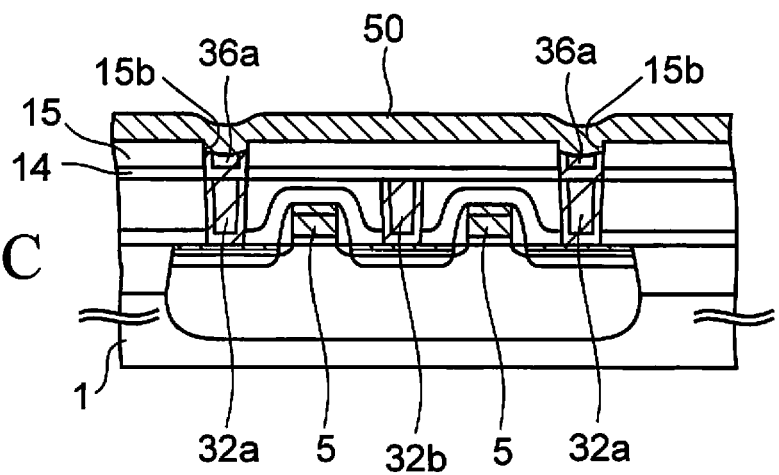

First, as shown in FIG. 11B, ammonia plasma treatment is performed on the underlying insulating film 15. Thereby, NH groups are bonded to oxygen atoms on the surface of the underlying insulating film 15.

In this ammonia plasma treatment, for example, a parallel-plate plasma treatment system is used. The parallel-plate plasma treatment system has a counter electrode at a distance of approximately 9 mm (350 mils) from the silicon substrate 1. While the substrate temperature is being maintained at 400° C. at a pressure of 266 Pa (2 Torr), an ammonia gas is supplied to the inside of a chamber at a flow rate of 350 sccm, and the treatment is performed by supplying a high-frequency power of 100 W at 13.56 MHz to the silicon substrate 1, and by supplying a high-frequency power of 55 W at 350 kHz to the above-described counter electrode for 60 seconds.

Next, as shown in FIG. 1C, a titanium film is formed as a planarization conductive film 50 on the underlying insulating film 15 and the third conductive plugs 36a. The planarization conductive film 50 is formed to have a thickness of 100 to 300 nm, e.g., approximately 100 nm. The recesses 15b are completely buried with this planarization conductive film 50.

Deposition conditions for this planarization conductive film 50 are not particularly limited. In the second embodiment, a sputtering system, in which the distance between the silicon substrate 1 and a titanium target is set to be 60 mm, is used. The planarization conductive film 50 is formed, by applying a sputtering DC power of 2.6 kW for 35 seconds, in an argon atmosphere at a pressure of 0.15 Pa under conditions in which the substrate temperature is 20° C.

Before the planarization conductive film 50 is formed, NH groups are bonded to oxygen atoms on the surface of the underlying insulating film 15 by ammonia plasma treatment (FIG. 11B). Accordingly, titanium atoms deposited on the underlying insulating film 15 are less prone to be captured by oxygen atoms. As a result, the titanium atoms can freely move on the surface of the underlying insulating film 15, and it is made possible to form the planarization conductive film 50 made of titanium which is strongly self-oriented in the (002) direction.

The planarization conductive film 50 is not limited to a titanium film. Any one of a tungsten film, a silicon film, and a copper film may be formed as the planarization conductive film 50.

Thereafter, RTA, in which the substrate temperature is set at 650° C., is performed on the planarization conductive film 50 in a nitrogen atmosphere to nitride the planarization conductive film 50 made of titanium. Thereby, the planarization conductive film 50 is formed of titanium nitride oriented in the (111) direction.

In this event, recessed portions are formed in the upper surface of the above-described planarization conductive film 50, reflecting the existence of the recesses 15b formed in the underlying insulating film 15 around the third conductive plugs 36a as described previously. However, when such recessed portions are formed, the crystallinity of a ferroelectric film, which is later formed above the planarization conductive film 50, may deteriorate.

Figure 11D:
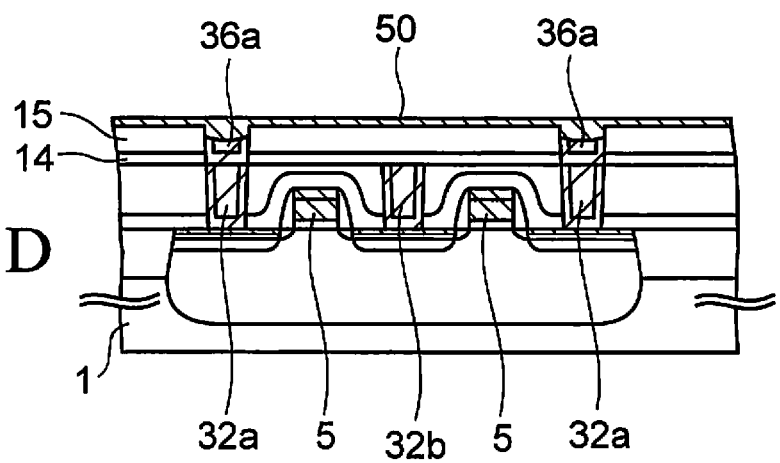

Accordingly, in the second embodiment, as shown in FIG. 11D, the upper surface of the planarization conductive film 50 is polished and planarized by CMP, and the above-described recessed portions are removed. Slurry used in this CMP is not particularly limited. In the second embodiment, SSW2000 manufactured by Cabot Microelectronics Corporation is used.

It should be noted that the thickness of the planarization conductive film 50 after CMP varies in the plane of the silicon substrate and among a plurality of silicon substrates due to polishing error. In this embodiment, in consideration of the variations, a target value of the thickness of the planarization conductive film 50 after CMP is set to be 50 to 100 nm, more preferably 50 nm, by controlling the polishing time.

After CMP is performed on the planarization conductive film 50 as described above, crystals in the vicinity of the upper surface of the planarization conductive film 50 are distorted due to polishing. However, when lower electrodes of capacitors are formed above the planarization conductive film 50 in which crystals are distorted, the lower electrodes are affected by the distortion, and the crystallinity of the lower electrodes deteriorate. Consequently, ferroelectric characteristics of the ferroelectric films thereon deteriorate.

Figure 11E:
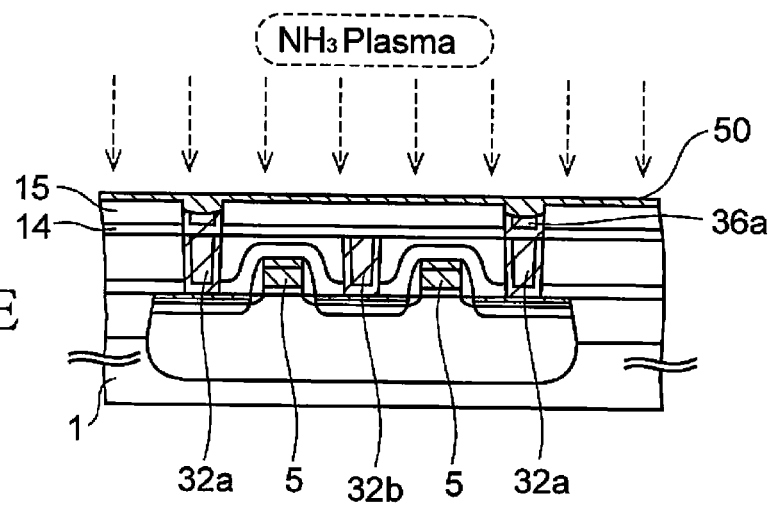

In order to avoid such a disadvantage as shown in FIG. 11E, the upper surface of the planarization conductive film 50 is exposed to an ammonia plasma in the next step so that the distortion of crystals of the planarization conductive film 50 is not transferred to a film thereon.

Figure 11F:
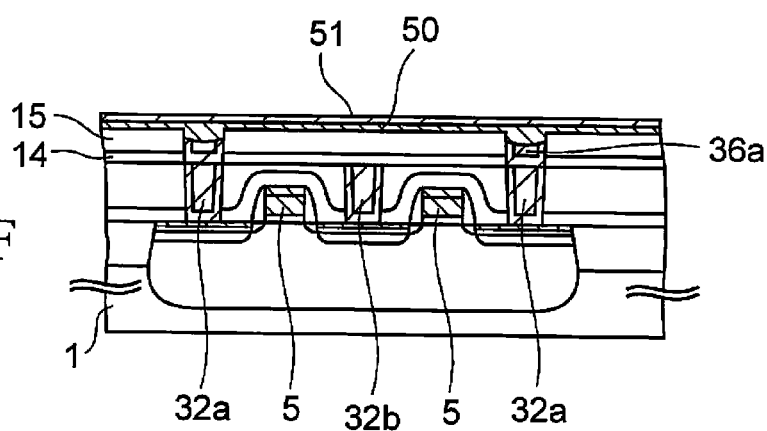

Next, as shown in FIG. 11F, an iridium film is formed as a conductive adhesion film 51 by sputtering on the planarization conductive film 50 in which the distortion of crystals is eliminated by the above-described ammonia plasma treatment. The conductive adhesion film 51 functions as a film for improving the adhesion strength between films formed thereon and thereunder. The thickness of the conductive adhesion film 51 is preferably formed to be as small as possible, e.g., not more than 20 nm, more preferably 5 nm to 10 nm.

Figure 11G:
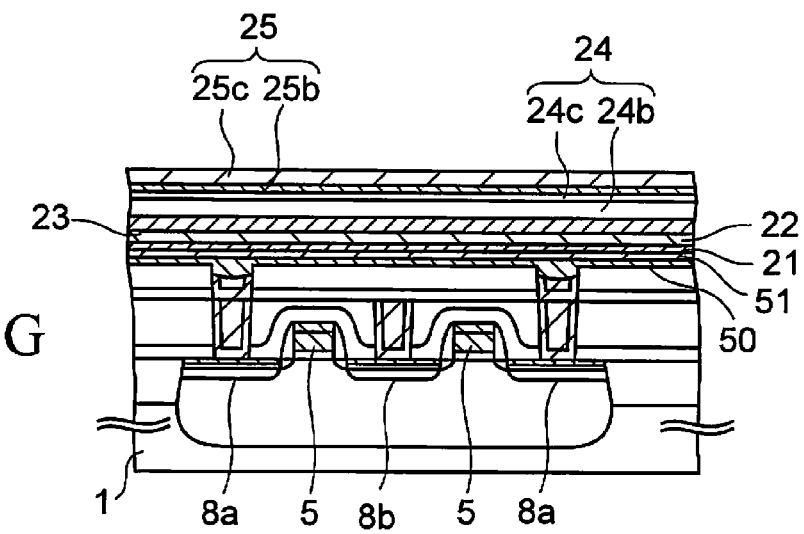

Subsequently, by performing the steps of FIGS. 1E to 1K described in the first embodiment, the underlying conductive film 21, the conductive oxygen barrier film 22, a first conductive film 23, the ferroelectric film 24 and the second conductive film 25 are superposed as shown in FIG. 11G.

In these steps, as described in the first embodiment, the ferroelectric film 24 are formed of the first ferroelectric film 24b and the second ferroelectric film 24c.

After the first ferroelectric film 24b is formed by MOCVD, the first ferroelectric film 24b is annealed in an atmosphere containing an oxidizing gas, e.g., a mixed atmosphere of oxygen and argon, using the same conditions as described with reference to FIG. 1I. Thereby, impurities such as water and carbon contained in the first ferroelectric film 24b are expelled to the outside of the film. Thus, ferroelectric characteristics of the first ferroelectric film 24b are improved.

Figure 11H:
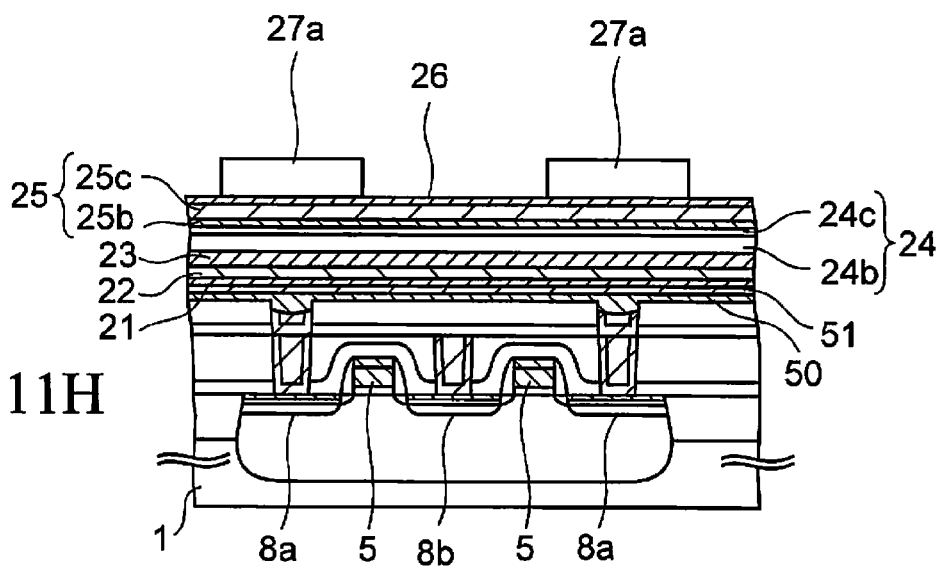

Subsequently, by performing the steps described with reference to FIGS. 1L and 1M, the first mask material layer 26 and the second hard mask 27a are formed on the second conductive film 25 as shown in FIG. 11H.

Figure 11I:
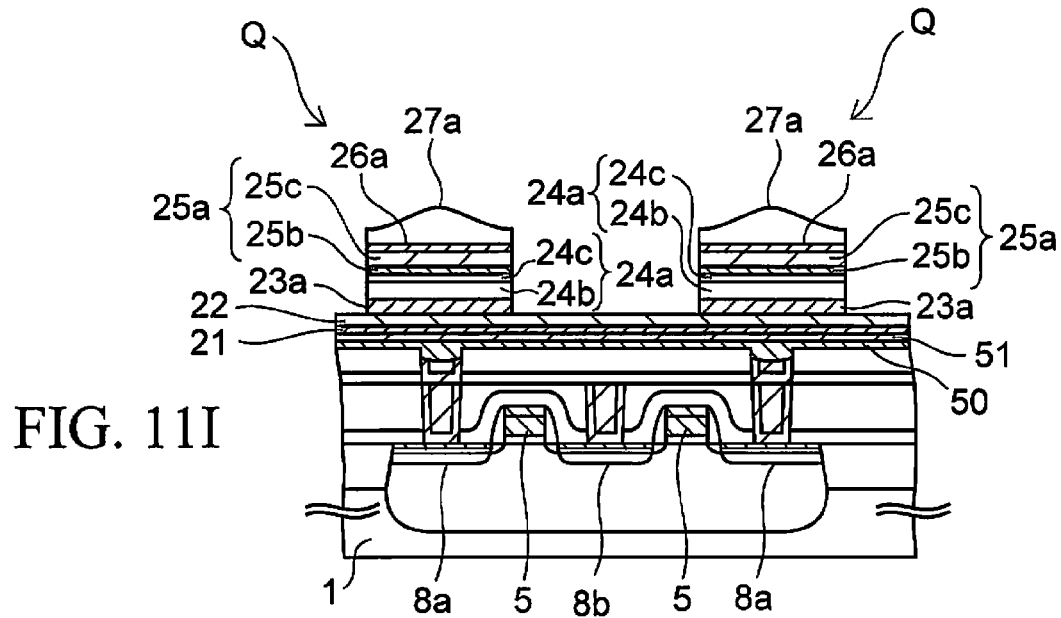

Next, as shown in FIG. 11I, the first mask material layer 26 is etched using the second hard mask 27a as a mask. Thereby, the first hard mask 26a is formed.

Thereafter, portions of the second conductive film 25, the ferroelectric film 24, and the first conductive film 23, which are not covered with the first and second hard masks 26a and 27a, are dry-etched. Thereby, the capacitors Q, each of which includes the lower electrode 25a, the capacitor dielectric film 24a and the upper electrode 23a, are formed.

In the etching, as in the first embodiment, a gas mixture of HBr and oxygen is used as an etching gas for the first and second conductive films 23 and 25, and a gas mixture of chlorine and argon is used as an etching gas for the ferroelectric film 24.

Figure 11J:
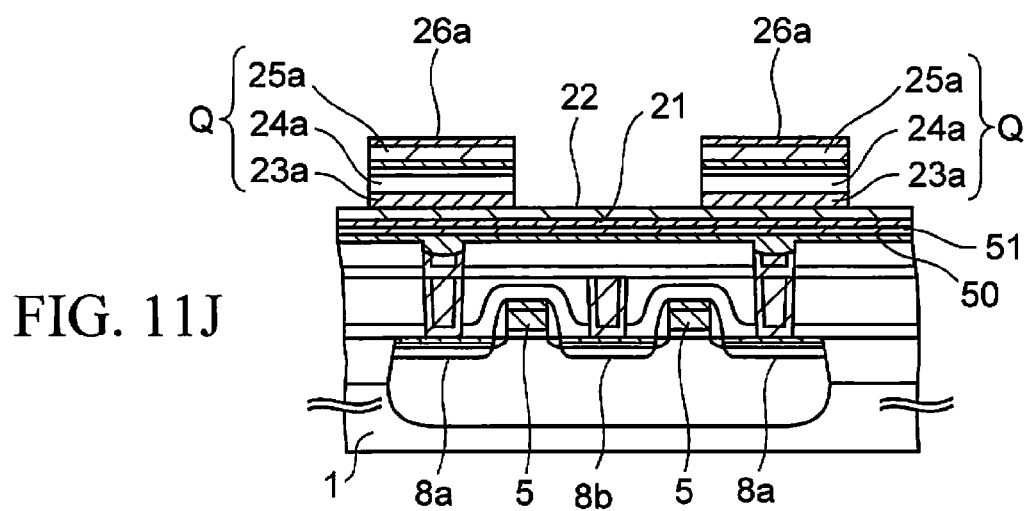

Subsequently, as shown in FIG. 11J, the second hard mask 27a made of silicon oxide is removed by wet etching using a mixed solution of hydrogen peroxide, ammonia, and water as an etchant. Incidentally, the second hard mask 27a may be removed by dry etching.

Figure 11K:
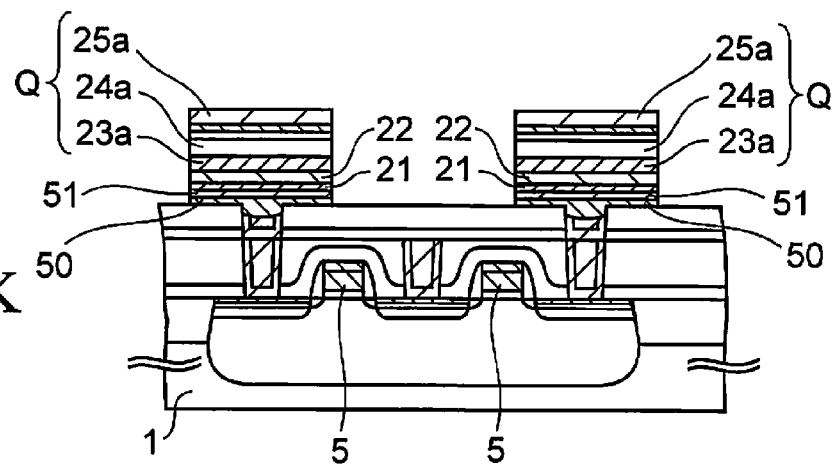

Next, steps for obtaining the cross-sectional structure shown in FIG. 11K will be described.

First, using the first hard mask 26a as a mask, the conductive oxygen barrier film 22, the underlying conductive film 21, the conductive adhesion film 51, and the planarization conductive film 50 are etched to leave these films only under the capacitors Q. This etching is performed by dry etching. As an etching gas therefor, for example, a gas mixture of argon and chlorine is used.

The first hard mask 26a is also etched by this etching gas. Accordingly, when the etching is finished, the first hard mask 26a is removed, and the upper surfaces of the upper electrodes 25a are exposed.

Figure 11L:
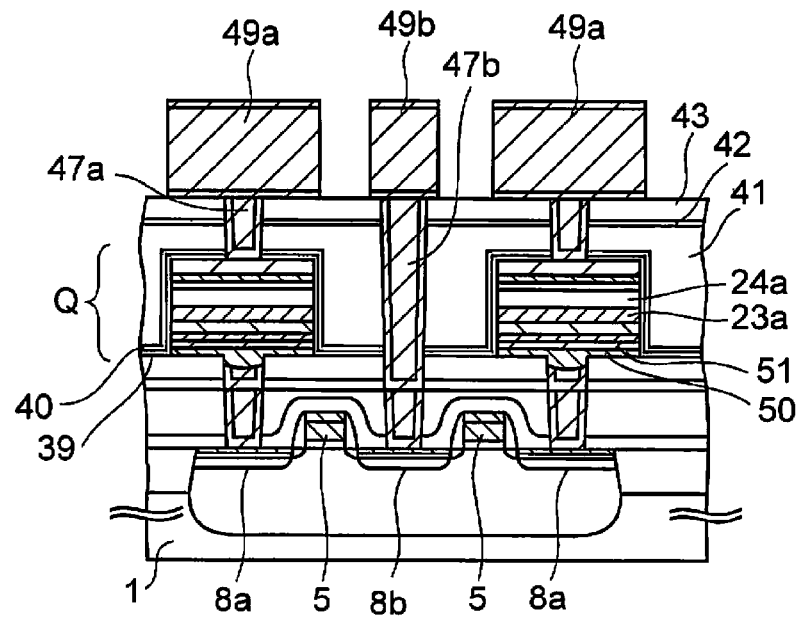

Thereafter, by performing the steps of FIGS. 1Q to 1W described in the first embodiment, the basic structure of the semiconductor device according to this embodiment as shown in FIG. 11L is completed.

According to the second embodiment described above, as described with reference to FIG. 11D, the recesses 15b formed around the third conductive plugs 36a by CMP is buried with the planarization conductive film 50, and then the planarization conductive film 50 is planarized by CMP.

Thus, the flatness of the lower electrodes 23a (see FIG. 11K) formed above the planarization conductive films 50 is favorable, and the orientation of the lower electrodes 23a is favorable. The orientation of the capacitor dielectric films 24a is also improved by the action of the orientation of the lower electrodes 23a. Hence, ferroelectric characteristics, such as switching charge amounts of the capacitor dielectric films 24a, are improved.

Also, as in the first embodiment, the capacitor dielectric films 24a each have a two-layer structure including the first ferroelectric film 24b and the second ferroelectric film 24c. Of these, the first ferroelectric film 24b, which is formed by MOCVD to have high crystallinity, is annealed in an atmosphere containing an oxidizing gas. Accordingly, impurities such as carbon and water, which causes deterioration of ferroelectric characteristics of the capacitor dielectric films 24a, are expelled from the first ferroelectric films 24b. Thus, ferroelectric characteristics of the capacitor dielectric films 24a are further improved.

(3) Third Embodiment

Figure 12:
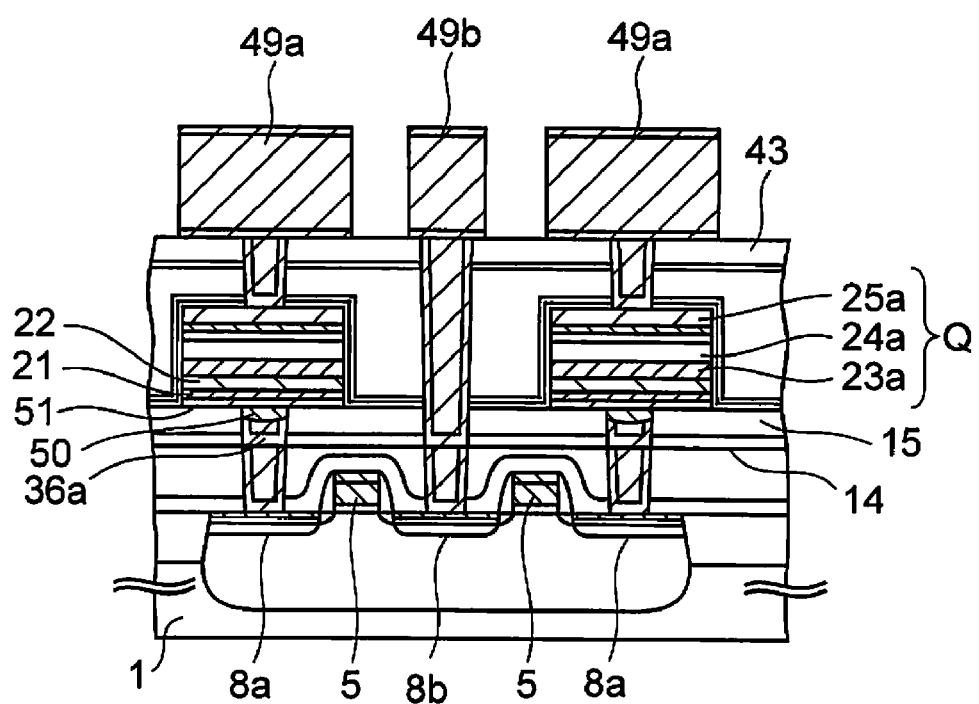
FIG. 12 is a cross-sectional view of a semiconductor device according to a third embodiment of the present invention.

FIG. 12 is a cross-sectional view of a semiconductor device according to a third embodiment.

The third embodiment differs from the second embodiment in the following point. In the third embodiment, in the CMP step of FIG. 11D, the planarization conductive film 50 is removed from the upper surface of the underlying insulating film 15 to leave the planarization conductive film 50 only in the recesses 15b. The third embodiment and the second embodiment are identical except for the above points.

Also in the third embodiment, the capacitor dielectric films 24a are formed of the first ferroelectric film 24b and the second ferroelectric film 24c, and the first ferroelectric film 24b is annealed in an atmosphere containing an oxidizing gas, e.g., a mixed atmosphere of oxygen and argon.

Thus, impurities such as carbon and water in the first ferroelectric film 24b are removed, and it is made possible to simultaneously achieve an increase in the switching charge, a decrease in the leakage current, a decrease in the fatigue, and an improvement in imprint characteristics, as in the first embodiment.

(4) Fourth Embodiment

Figure 13A:
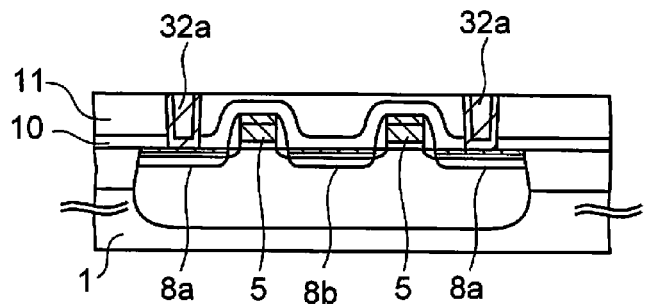
FIGS. 13A to 13O are cross-sectional views of a semiconductor device according to a fourth embodiment of the present invention, the semiconductor device being in a process of being manufactured.
Figure 13B:
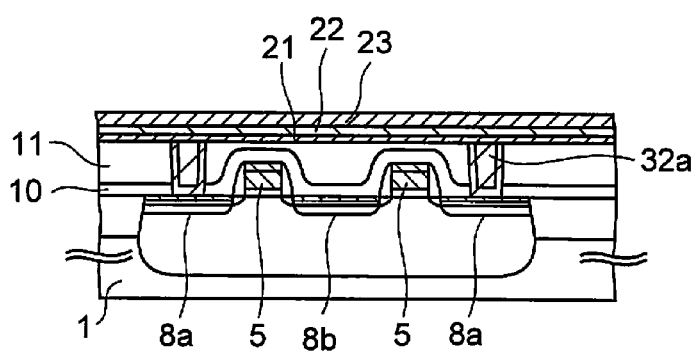
Figure 13C:
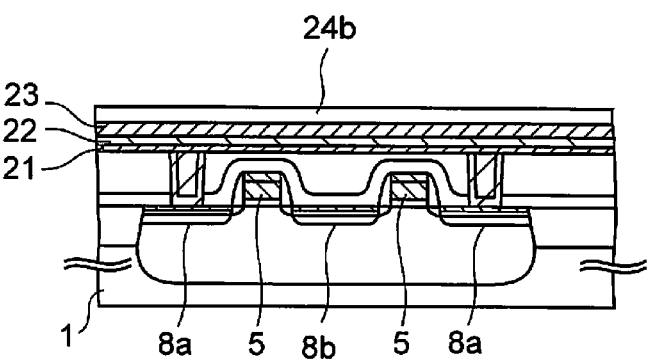
Figure 13D:
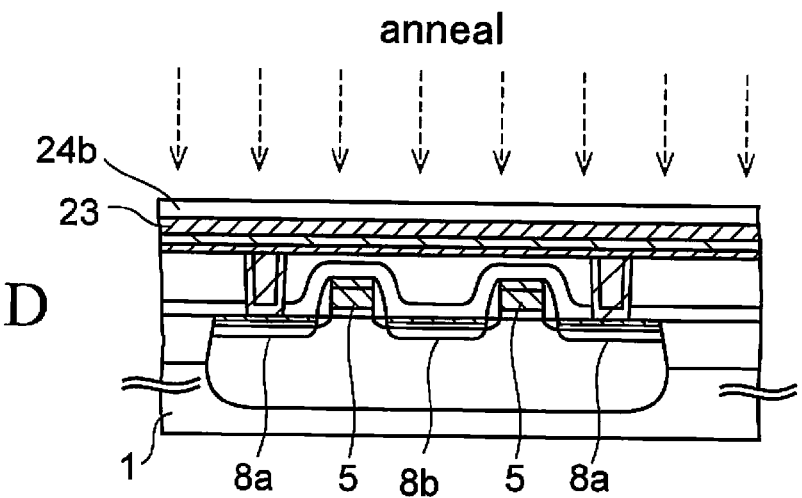
Figure 13E:
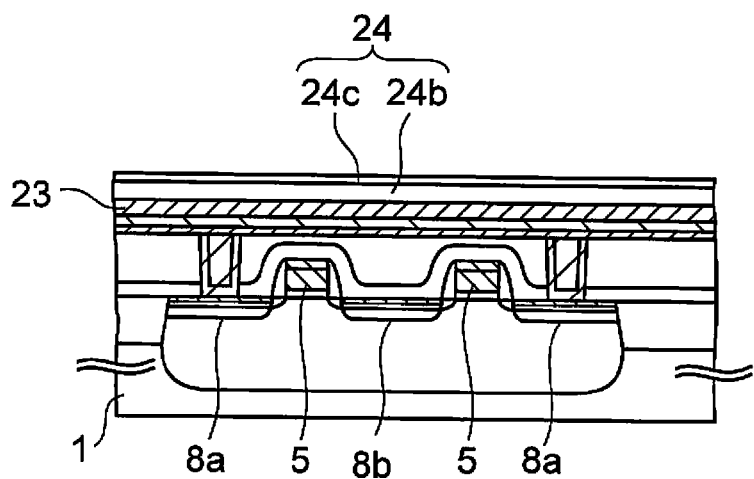
Figure 13F:
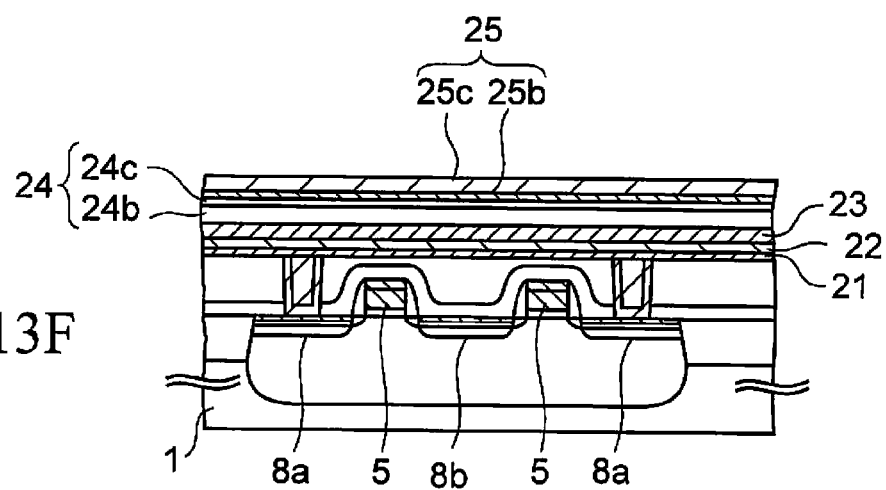
Figure 13G:
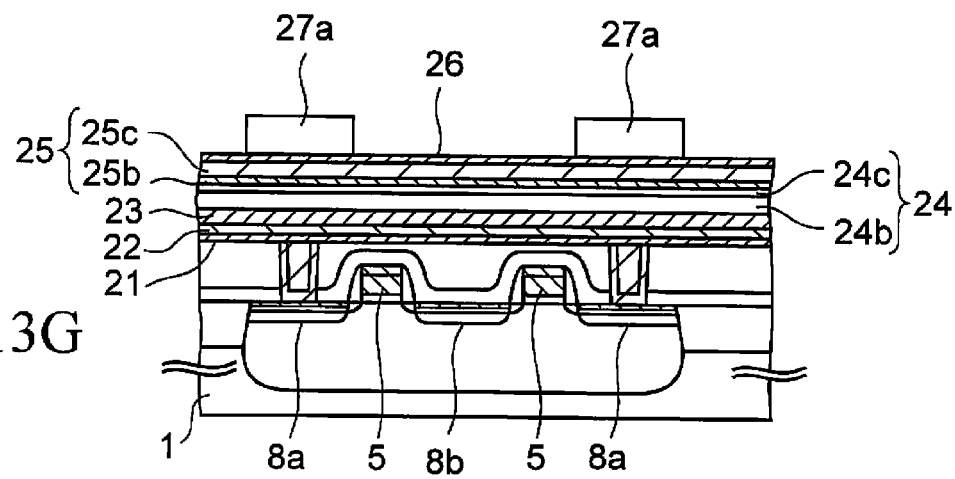
Figure 13H:
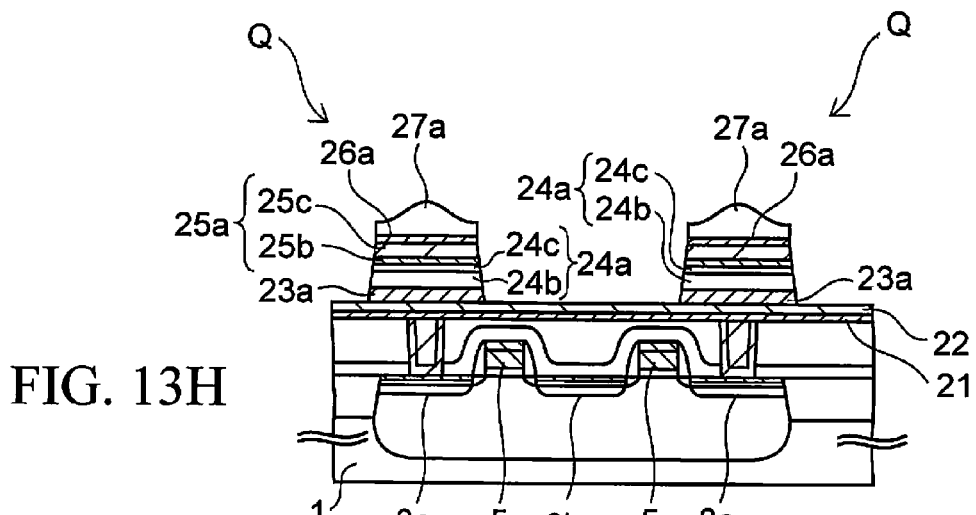
Figure 13I:
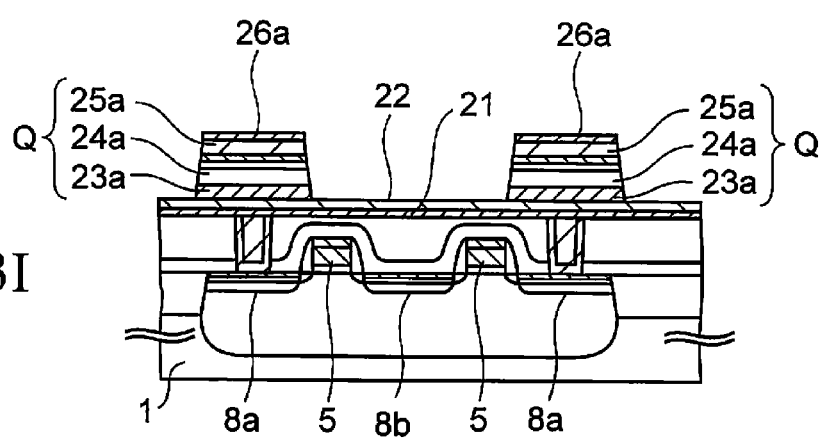
Figure 13J:
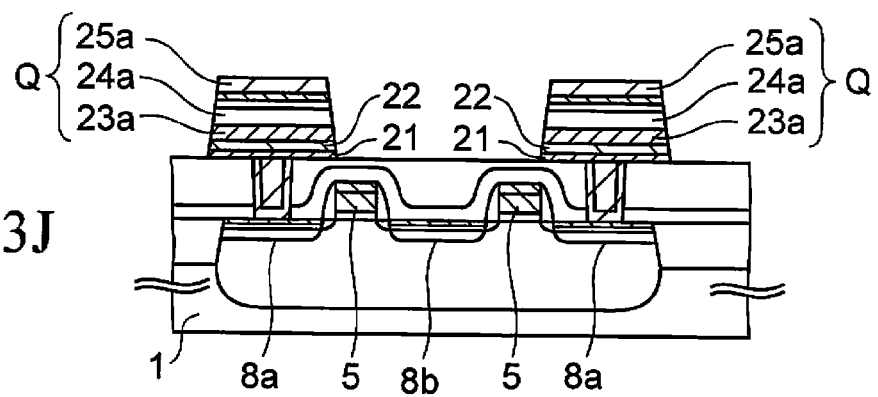
Figure 13K:
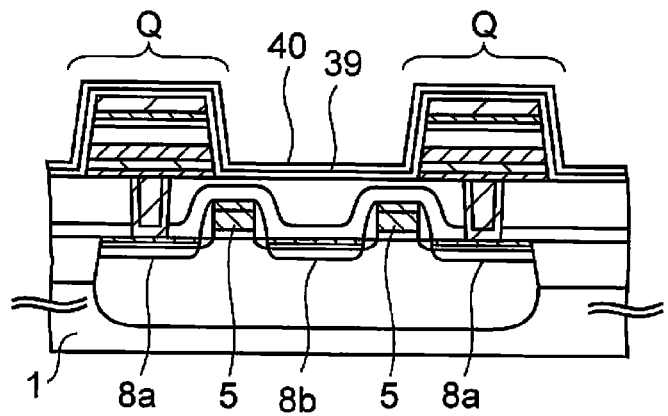
Figure 13L:
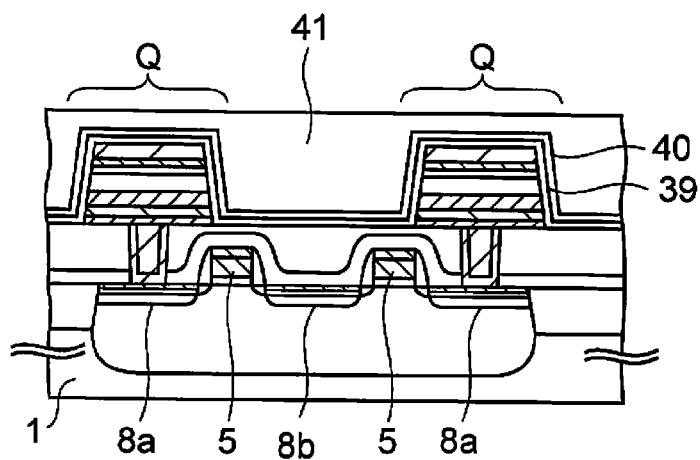
Figure 13M:
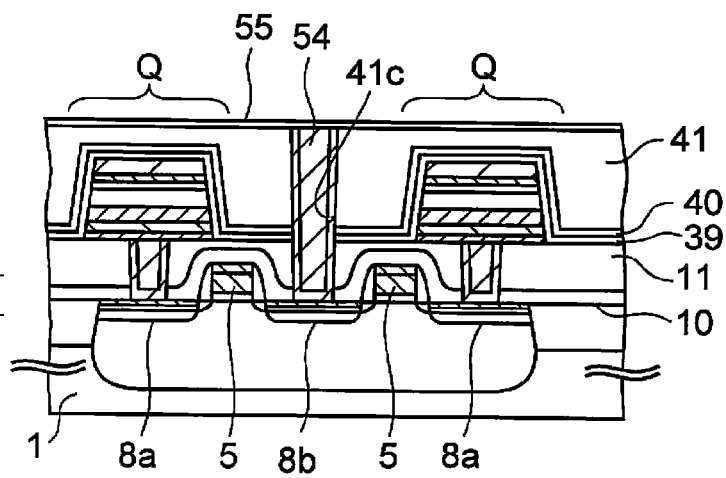
Figure 13N:
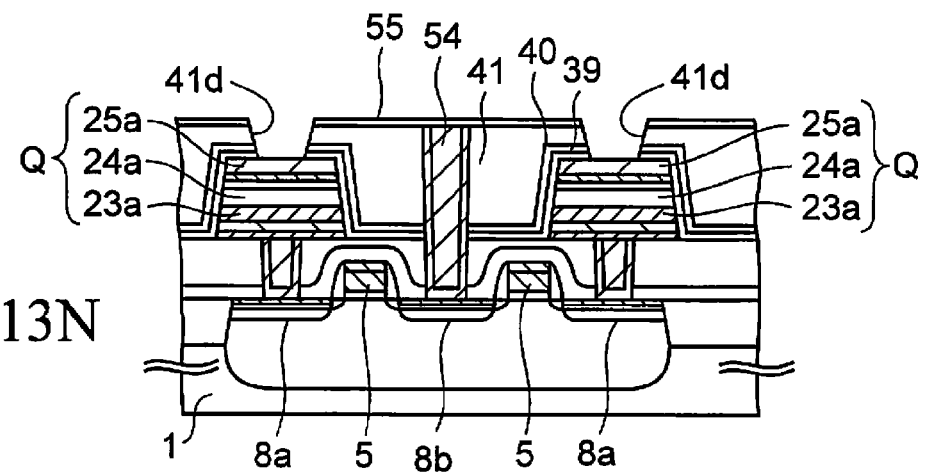
Figure 13O:
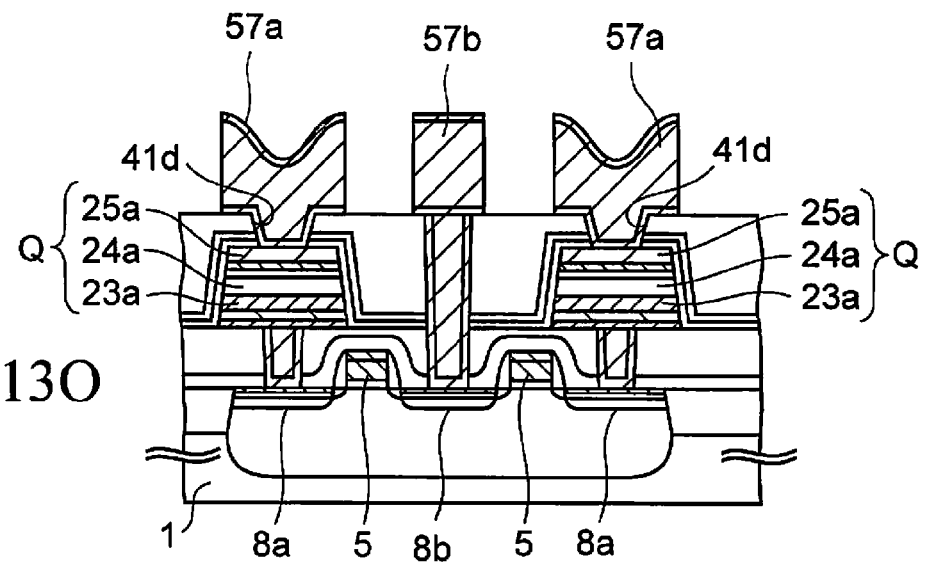

FIGS. 13A to 13O are cross-sectional views of a semiconductor device according to a fourth embodiment in the process of being manufactured. In these drawings, elements described in the first embodiment are denoted by the same reference numerals as in the first embodiment, and will not be further described below.

At the beginning, steps for obtaining the cross-sectional structure shown in FIG. 13A will be described.

First, according to the step described with reference to FIG. 1A of the first embodiment, the cover insulating film 10 and the first interlayer insulating film 11 are formed on the silicon substrate 1, and these insulating films are patterned. Thereby, contact holes are formed over the first source/drain regions 8a.

Moreover, a glue film and a tungsten film are formed in this order in these contact holes. Then, unnecessary portions of the glue film and the tungsten film on the first interlayer insulating film 11 are polished and removed by CMP to leave these films only in the contact holes. The films left in the contact holes are respectively used as first conductive plugs 32a.

Next, as shown in FIG. 13B, a titanium film is formed on the first interlayer insulating film 11 and the first conductive plugs 32*a*. This titanium film is formed to have a thickness of approximately 20 nm, and is used as an underlying conductive film 21.

Incidentally, ammonia plasma treatment may be performed in advance on each of the upper surfaces of the first interlayer insulating film 11 and the first conductive plugs 32*a* before the underlying conductive film 21 is formed. By performing this ammonia plasma treatment, titanium atoms deposited on the first interlayer insulating film 11 are made less prone to be captured by oxygen atoms on the surface of the insulating film 11. Thus, the titanium atoms can freely move on the surface of the first interlayer insulating film 11, and it is made possible to form the underlying conductive film 21 made of titanium which is strongly self-oriented in the (002) direction.

Thereafter, RTA, in which the substrate temperature and the treatment time are respectively set to be 650° C. and 60 seconds, is performed on the underlying insulating film 21 in a nitrogen atmosphere. Thereby, the underlying conductive film 21 made of titanium is nitrided, and the underlying conductive film 21 is formed of titanium nitride oriented in the (111) direction.

Furthermore, a titanium aluminum nitride film is formed as the conductive oxygen barrier film 22 on the underlying conductive film 21. The conductive oxygen barrier film 22 is formed to have a thickness of 100 nm by reactive sputtering.

Then, an iridium film is formed as the first conductive film 23 on the conductive oxygen barrier film 22. The first conductive film 23 is formed to have a thickness of approximately 100 nm by sputtering.

Thereafter, in order to improve the crystallinity and adhesion of the first conductive film 23, RTA, in which the substrate temperature is set at a temperature of not lower than 650° C., is performed on the first conductive film 23 in an argon atmosphere for 60 seconds.

Subsequently, as shown in FIG. 13C, a PZT film is formed on the first conductive film 23 by MOCVD. This PZT film is used as the first ferroelectric film 24*b*.

The first ferroelectric film 24*b* is not limited to a PZT film. A film, in which the crystal structure is a Bi layered structure or a perovskite structure, may be formed as the first ferroelectric film 24*b* by heat treatment. Of these, films having perovskite structures include a PZT film doped with a very small amount of any one of lanthanum, calcium, strontium, and silicon.

On the other hand, films having Bi layered structures include a $(Bi_{1-x}R_x)Ti_3O_{12}$ (R is a rare-earth element, and 0<x<1) film, a $SrBi_2Ta_2O_9$ film, and a $SrBi_4Ti_4O_{15}$ film.

Next, as shown in FIG. 13D, in order to expel, to the outside of the film, impurities such as organic materials and water introduced into the first ferroelectric film 24*b* during deposition thereof by MOCVD or exposure thereof to the air, the first ferroelectric film 24*b* is annealed in an atmosphere containing an oxidizing gas.

Conditions for this annealing are not particularly limited. In the fourth embodiment, the annealing is performed in a mixed atmosphere of an argon gas and oxygen by means of atmospheric-pressure RTA in which the substrate temperature is set at a temperature of 575° C. to 650° C., e.g., 600° C. In this case, the flow rates of an argon gas and oxygen are respectively set at 50 sccm and 2000 sccm, and the heat treatment time is set to be 30 seconds to 120 seconds, e.g., 60 seconds.

The oxidizing gas used in this annealing is not limited to an oxygen gas. Any one of an oxygen gas, an ozone gas, and a nitrogen dioxide gas may be used as the oxidizing gas.

Subsequently, as shown in FIG. 13E, an amorphous PZT film is formed as the second ferroelectric film 24*c* on the first ferroelectric film 24*b* by use of sputtering. The first and second ferroelectric films 24*b* and 24*c* are together used as the ferroelectric film 24.

The second ferroelectric film 24*c* is not limited to a PZT film. As in the case of the first ferroelectric film 24*b*, a PZT film doped with a very small amount of any one of lanthanum, calcium, strontium, and silicon may be formed as the second ferroelectric film 24*c*. Alternatively, the second ferroelectric film 24*c* may be formed of a material having a Bi layered structure such as $(Bi_{1-x}R_x)Ti_3O_{12}$ (R is a rare-earth element, and 0<x<1), $SrBi_2Ta_2O_9$, or $SrBi_4Ti_4O_{15}$.

Subsequently, as shown in FIG. 13F, by performing the step of FIG. 1K described in the first embodiment, the second conductive film 25, which is formed of the metal oxide film 25*b* and the conductivity-improving film 25*c*, is formed on the ferroelectric film 24.

Next, as shown in FIG. 13G, the first mask material layer 26 made of titanium nitride is formed on the second conductive film 25 by sputtering.

Then, a silicon oxide film is formed on the first mask material layer 36 by plasma CVD using a TEOS gas, and the silicon oxide mask is patterned to form the second hard mask 27*a*.

Subsequently, as shown in FIG. 13H, the first mask material layer 26 is etched using the second hard mask 27*a* as a mask. Thereby, the first hard mask 26*a* is formed.

Thereafter, portions of the second conductive film 25, the ferroelectric film 24, and the first conductive film 23, which are not covered with the first and second hard masks 26*a* and 27*a*, are dry-etched. Hence, the capacitors Q, each of which includes the lower electrode 25*a*, the capacitor dielectric film 24*a* and the upper electrode 23*a*, are formed.

Conditions for this dry etching have been described with reference to FIG. 1N in the first embodiment, and therefore will not be further described.

Although the above-described dry etching is performed, the conductive oxygen barrier film 22 is left on the entire surface of the underlying conductive film 21 without being etched.

Next, as shown in FIG. 13I, the second hard mask 27*a* is removed by wet etching or dry etching. In the case of wet etching, a mixed solution of hydrogen peroxide, ammonia, and water is used as an etchant.

Subsequently, steps for obtaining the cross-sectional structure shown in FIG. 13J will be described.

First, using the first hard mask 26*a* as a mask and using a gas mixture of argon and chlorine as an etching gas, the underlying conductive film 21 and the conductive oxygen barrier film 22 are dry-etched to leave these films only under the capacitors Q.

It should be noted that, since the first hard mask 26*a* is also etched by this etching gas, the first hard mask 26*a* is removed when the etching is finished, and the upper surfaces of the upper electrodes 25*a* are exposed.

Next, as shown in FIG. 13K, in order to protect the capacitors Q from reducing substances such as hydrogen, an alumina film is formed as the first capacitor protection insulating film 39 on the entire upper surface of the silicon substrate 1. The first capacitor protection insulating film 39 is formed to have a thickness of approximately 20 nm.

Then, in order to recover damage to the capacitor dielectric films 24*a* during the dry etching (see FIG. 13J) performed when the capacitors Q are formed and during the deposition of the first capacitor protection insulating film 39 by sputtering, recovery annealing is performed on the capacitor dielectric films 24a in an oxygen-containing atmosphere. With regard to conditions for this recovery annealing, the substrate temperature is set at a temperature of 550° C. to 700° C., e.g., 650° C., in a furnace, and the recovery annealing is performed for approximately 60 minutes.

Thereafter, an alumina film is formed on the first capacitor protection insulating film 39. The alumina film is formed to have a thickness of approximately 20 nm by use of CVD. This alumina film is used as the second capacitor protection insulating film 40.

Subsequently, as shown in FIG. 13L, a silicon oxide film is formed as the second interlayer insulating film 41 on the second capacitor protection insulating film 40 by plasma CVD using a TEOS gas as a reaction gas. An oxygen gas and a helium gas are also contained in the reaction gas. The second interlayer insulating film 41 has a thickness of 1500 nm on the flat surface of the silicon substrate 1.

Instead of the silicon oxide film, an insulating inorganic film may be formed as the second interlayer insulating film 41.

Thereafter, the surface of the second interlayer insulating film 41 is polished and planarized by CMP.

Next, steps for obtaining the cross-sectional structure shown in FIG. 13M will be described.

First, the surface of the second interlayer insulating film 41 is exposed to a $N_2O$ plasma. Thereby, water remaining in the second interlayer insulating film 41 is removed, and water is prevented from being reabsorbed into the second interlayer insulating film 41.

$N_2$ plasma treatment may be performed as this dehydrating treatment.

Subsequently, the cover insulating film 10, the first and second interlayer insulating films 11 and 41, and the first and second capacitor protection insulating films 39 and 40 are patterned. Thereby, a first hole 41c is formed in these insulating films over the second source/drain region 8b.

A glue film and a tungsten film are formed in order from the lower tier to the upper tier in the first hole 41c. Thereafter, unnecessary portions of the glue film and the tungsten film on the second interlayer insulating film 41 are polished and removed by CMP to leave these films only in the first hole 41c. The films left in the first hole 41c are together used as a second conductive plug 54.

The second conductive plug 54 constitutes part of the bit line, and is electrically connected to the second source/drain region 8b.

The second conductive plug 54 consists primarily of tungsten prone to oxidation, and is therefore prone to cause a contact failure when oxidized in the process.

Accordingly, in order to prevent the oxidation of the second conductive plug 54, a silicon oxynitride film is formed on each of the respective upper surfaces of the second interlayer insulating film 41 and the second conductive plug 54. The silicon oxynitride film is formed to have a thickness of approximately 100 nm. This silicon oxynitride film is used as an anti-oxidation insulating film 55.

Next, as shown in FIG. 13N, the first and second capacitor protection insulating films 39 and 40, the second interlayer insulating film 41, and the anti-oxidation insulating film 55 are patterned. Thereby, second holes 41d are formed in these insulating films on the upper electrodes 25a.

After the second holes 41d are formed, in order to recover damage to the capacitor dielectric films 24a caused in the steps described so far, annealing may be performed in an oxygen-containing atmosphere. Even when annealing is thus performed, the oxidation of the second conductive plug 54 is prevented by the anti-oxidation insulating film 55.

Thereafter, the anti-oxidation insulating film 55 is etched back to be removed.

Subsequently, as shown in FIG. 13O, a metal film stack is formed on each of the upper surfaces of the second interlayer insulating film 41 and the second conductive plug 54 by sputtering. This metal film stack is patterned to form metal interconnections 57a and a conductive pad 57b used for the bit line.

The metal film stack is made by forming a titanium film having a thickness of 60 nm, a titanium nitride film having a thickness of 30 nm, a copper-containing aluminum film having a thickness of 400 nm, a titanium film having a thickness of 5 nm, and a titanium nitride film having a thickness of 70 nm in order from the lower tier to the upper tier.

With the above-described steps, the basic structure of the semiconductor device according to the fourth embodiment is completed.

In the fourth embodiment described above, the third conductive plugs 36a and the underlying insulating film 15 of the first embodiment are not formed. Accordingly, the process can be simplified compared to that of the first embodiment.

Furthermore, the second conductive plug 54, which constitutes part of the bit line over the second source/drain region 8b, includes only one layer. Accordingly, a simpler structure is obtained than that in the first embodiment in which two layers of conductive plugs 32b and 47b are formed.

Also, as in the first embodiment, the first ferroelectric dielectric film 24b formed by MOCVD is annealed in an atmosphere containing an oxidizing gas. Accordingly, impurities such as water and organic materials contained in the first ferroelectric film 24b are removed, and it is made possible to simultaneously achieve an increase in the switching charge amount, a decrease in the leakage current, a decrease in the fatigue, and an improvement in imprint characteristics.

(5) Fifth Embodiment

Figure 14A:
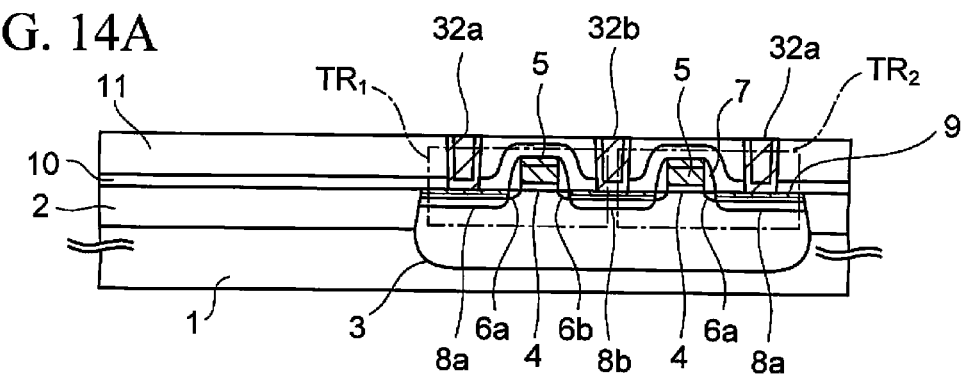
FIGS. 14A to 14N are cross-sectional views of a semiconductor device according to a fifth embodiment of the present invention, the semiconductor device being in a process of being manufactured.
Figure 14B:
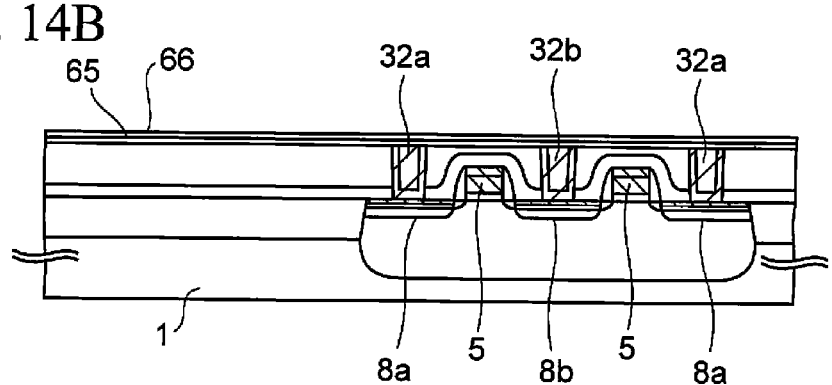
Figure 14C:
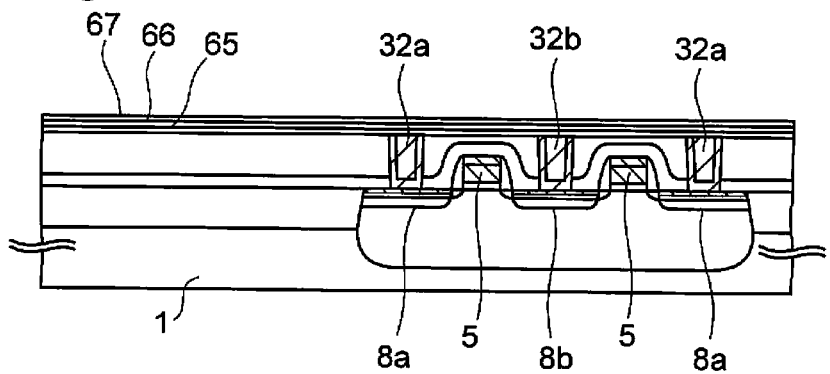
Figure 14D:
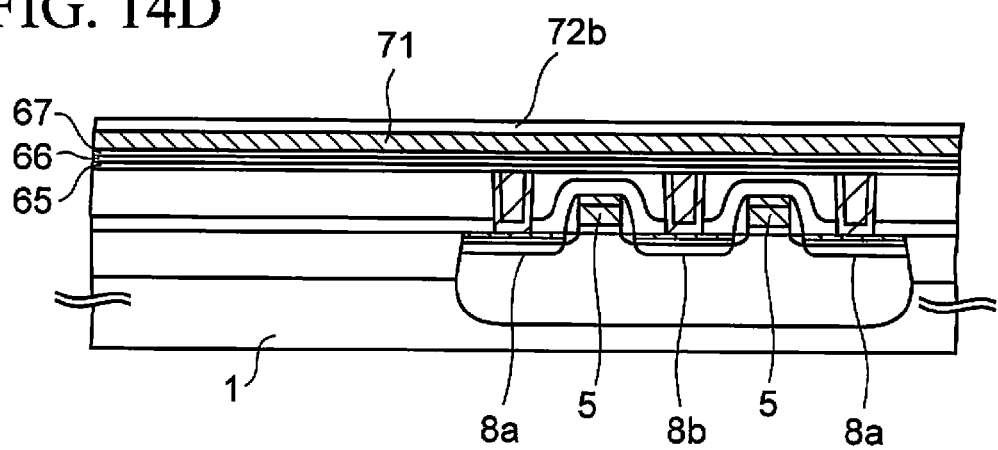
Figure 14E:
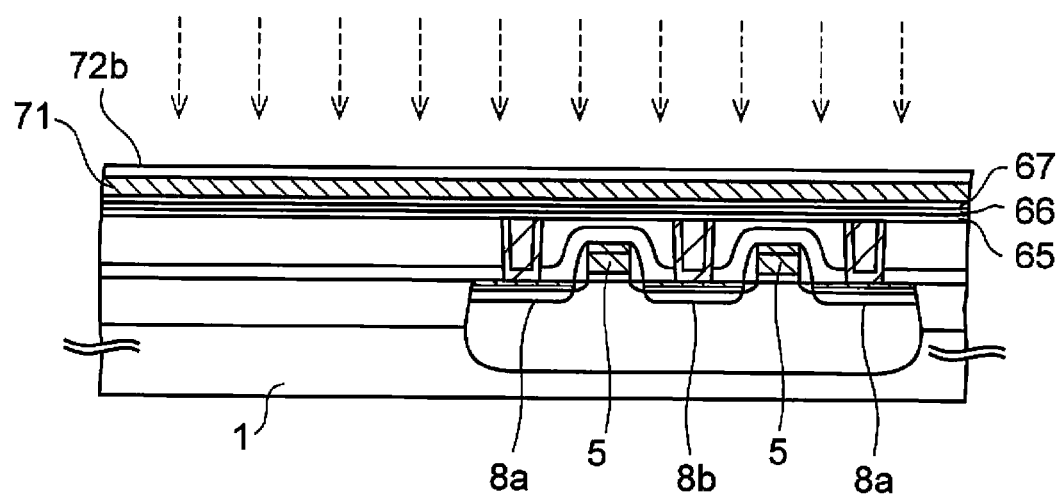
Figure 14F:
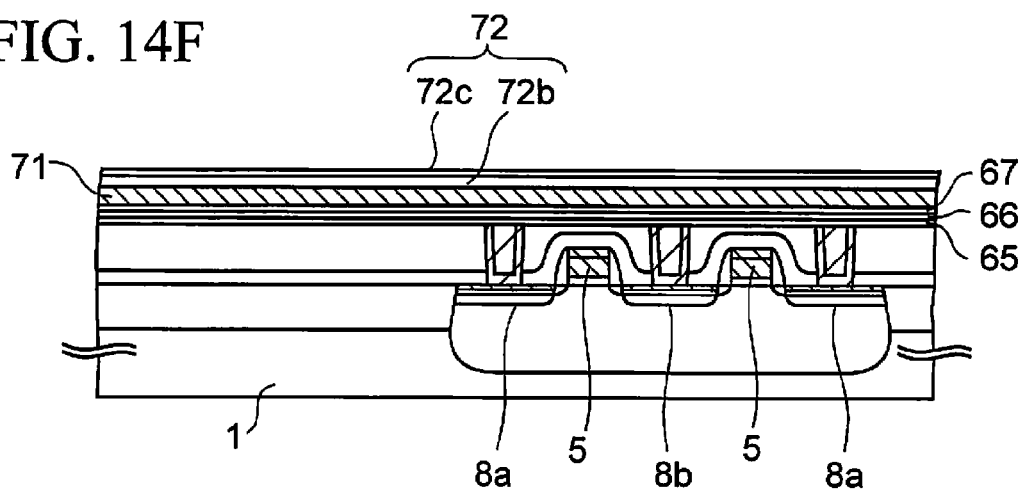
Figure 14G:
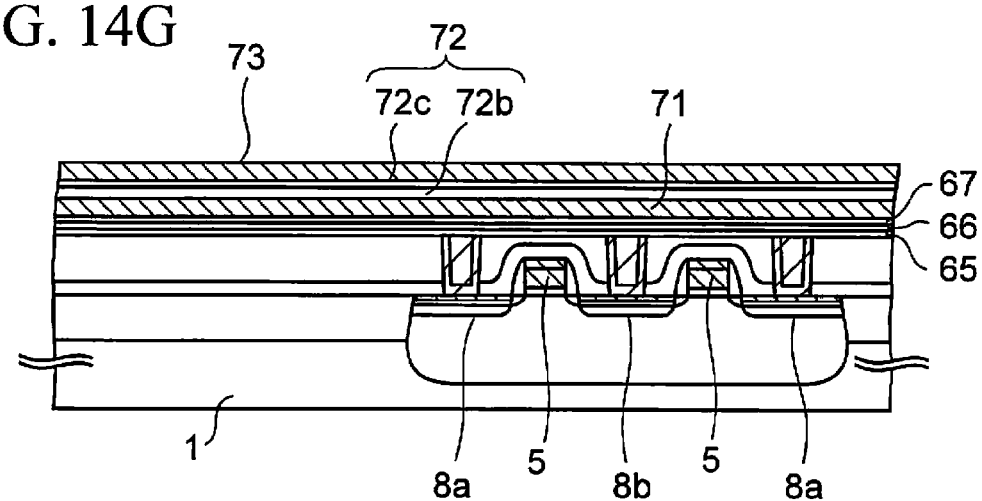
Figure 14H:
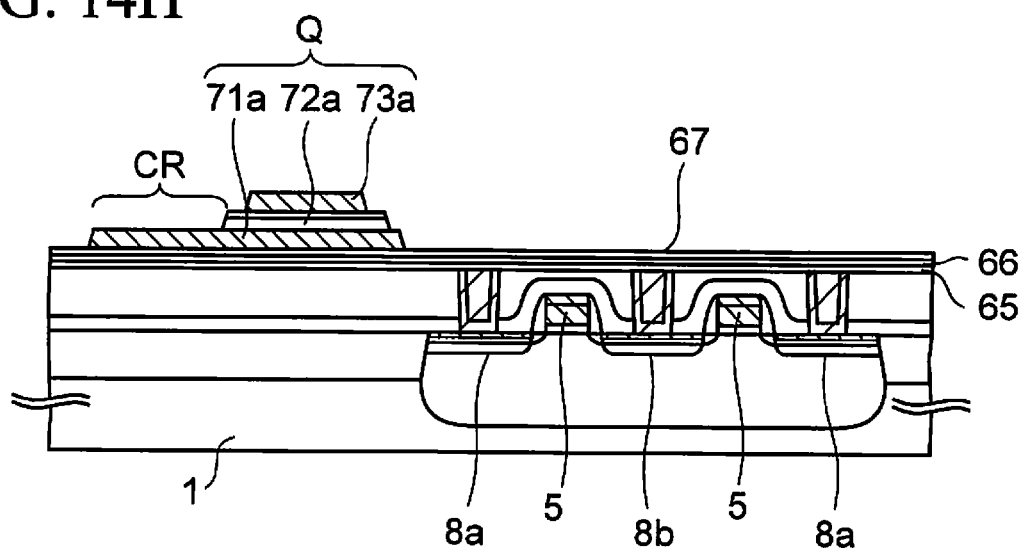
Figure 14I:
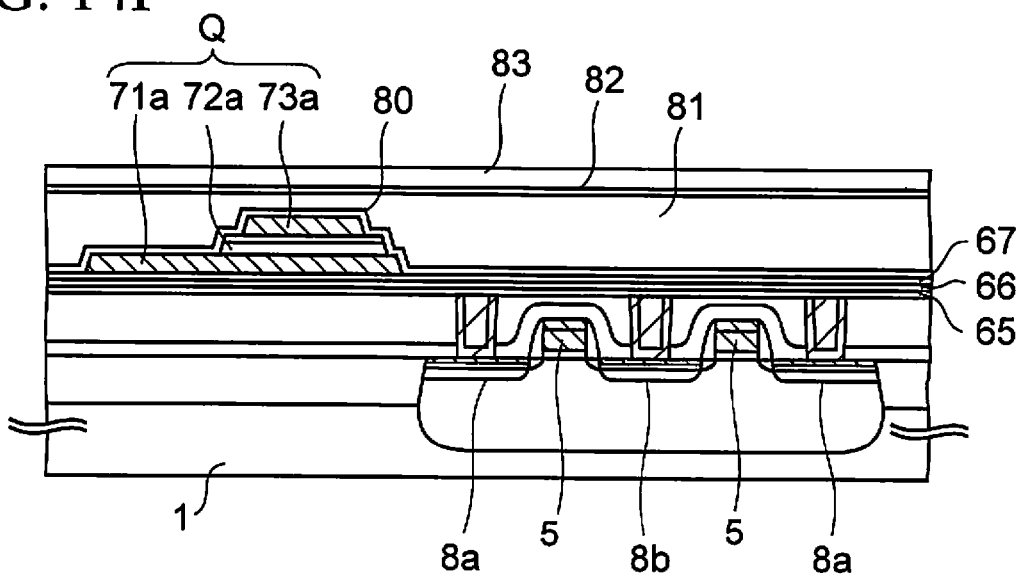
Figure 14J:
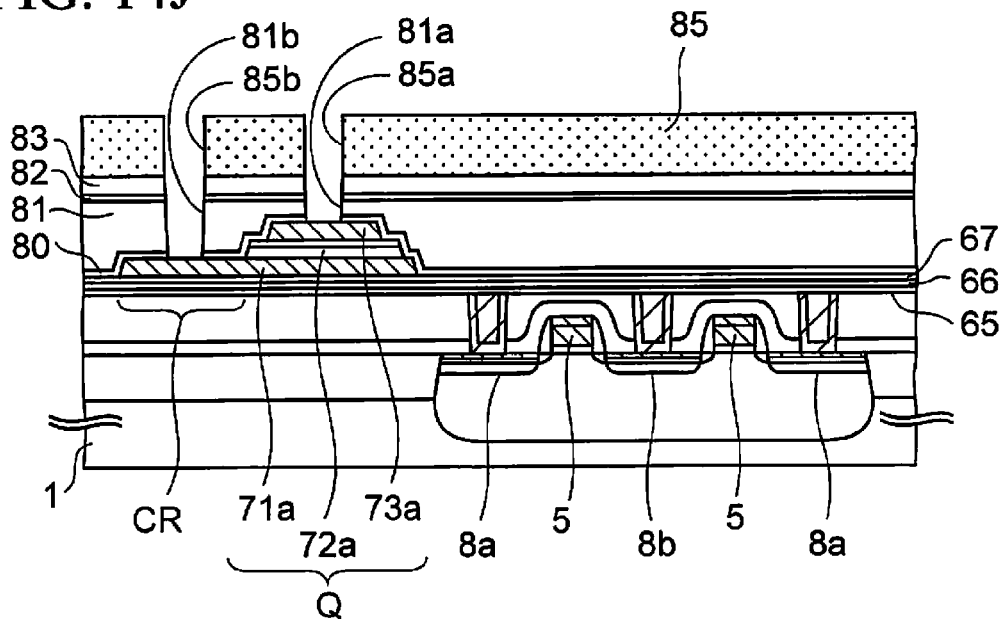
Figure 14K:
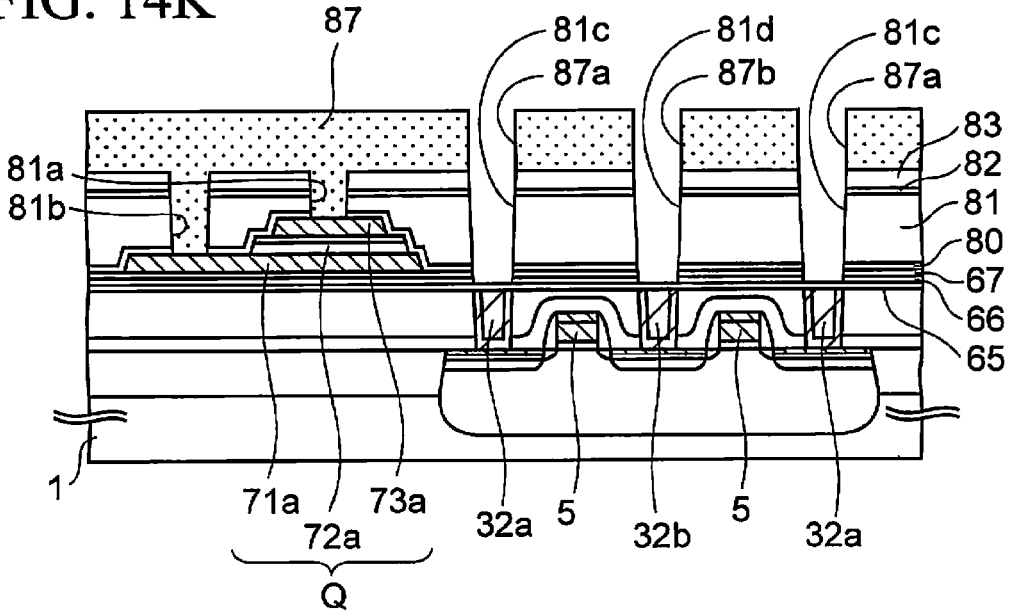
Figure 14L:
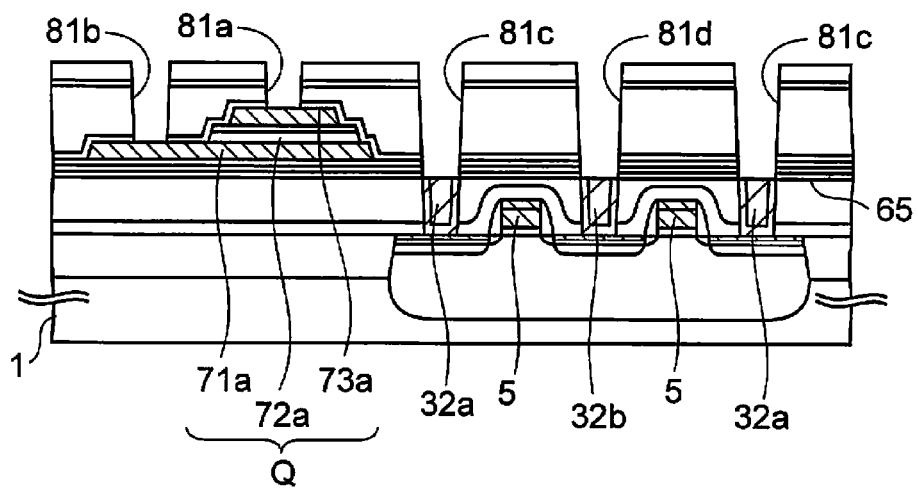
Figure 14M:
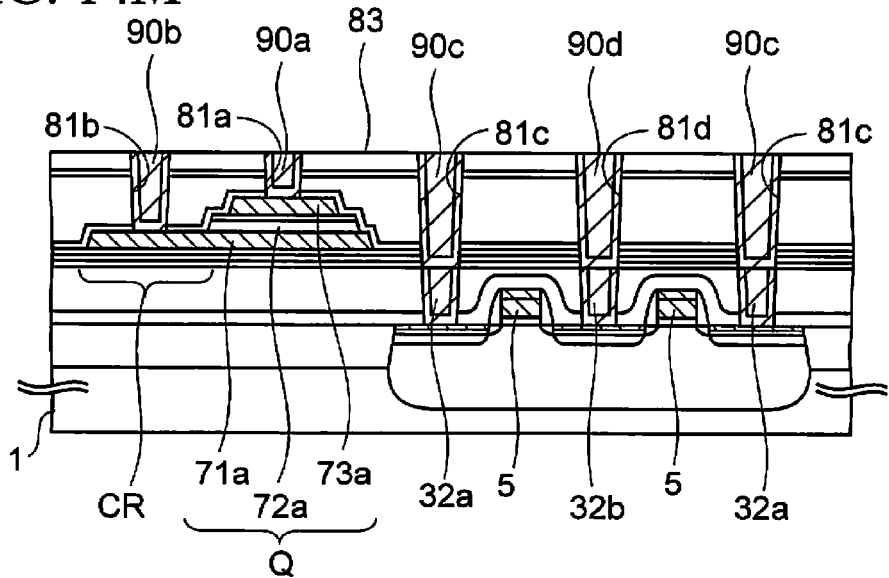
Figure 14N:
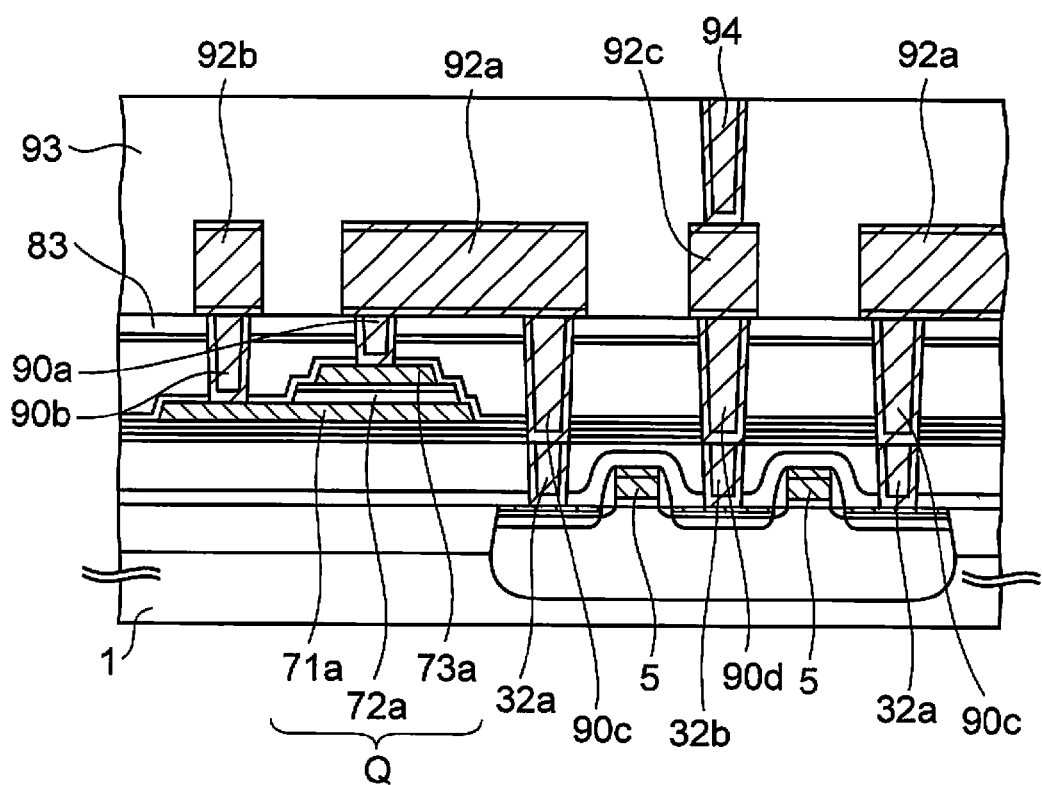

FIGS. 14A to 14N are cross-sectional views of a semiconductor device according to a fifth embodiment in the process of being manufactured.

The semiconductor device is a planar FeRAM, and is fabricated as follows.

First, as described with reference to FIG. 1A of the first embodiment, contact holes are formed in the first interlayer insulating film 11, and the first and second conductive plugs 32a and 32b are formed in each contact hole. Thereby, the cross-sectional structure shown in FIG. 14A is obtained.

The first and second conductive plugs 32a and 32b consist primarily of tungsten very prone to oxidation, and therefore cause a contact failure when oxidized in the process.

Accordingly, in the next step, as shown in FIG. 14B, a silicon oxynitride film is formed to have a thickness of approximately 100 nm by plasma CVD as an anti-oxidation insulating film 65 for protecting the above-described first and second conductive plugs 32a and 32b from an oxidizing atmosphere. Furthermore, a silicon oxide film is formed on this anti-oxidation insulating film 65. The silicon oxide film is formed to have a thickness of approximately 130 nm by means of plasma CVD using a TEOS gas, and is used as an insulating adhesion film 66.

Thereafter, as shown in FIG. 14C, in order to improve the crystallinity of a lower electrode of an undermentioned ferroelectric capacitor, and to ultimately improve the crystallinity of a capacitor dielectric film, an alumina film 67 is formed to have a thickness of approximately 20 nm by means of sputtering.

Next, steps for obtaining the cross-sectional structure shown in FIG. 14D will be described.

First, a noble metal film, e.g., an iridium film, is formed to have a thickness of approximately 150 nm by means of sputtering. The noble metal film is used as a first conductive film 71.

Subsequently, a PZT film is formed as a first ferroelectric film 72b on the first conductive film 71. The first ferroelectric film 72b is formed to have a thickness of approximately 100 nm by use of MOCVD. The first ferroelectric film 72b formed by MOCVD is already crystallized at the time of deposition. Accordingly, annealing for crystallization does not need to be performed on the first ferroelectric film 72b.

Methods of depositing the first ferroelectric film 72b include sputtering and the sol-gel method in addition to MOCVD. Furthermore, a material for the first ferroelectric film 72b is not limited to the above-described PZT. The first ferroelectric film 72b may be formed of a Bi layered compound such as $(Bi_{1-x}R_x)Ti_3O_{12}$ (R is a rare-earth element, and 0<x<1), $SrBi_2Ta_2O_9$, or $SrBi_4Ti_4O_{15}$, or a material obtained by doping PZT with at least one of lanthanum, calcium, strontium, and silicon.

Next, as shown in FIG. 14E, in order to remove impurities such as water and carbon introduced into the first ferroelectric film 72b during deposition by MOCVD or exposure to the air, the first ferroelectric film 72b is annealed in an atmosphere containing an oxidizing gas.

The annealing is performed in, for example, a mixed atmosphere of an argon gas and oxygen by atmospheric-pressure RTA in which the substrate temperature is set at a temperature of 575° C. to 650° C., e.g., 600° C. The flow rates of an argon gas and oxygen are respectively set at 50 sccm and 2000 sccm, and the heat treatment time is set to be 30 seconds to 120 seconds, e.g., 60 seconds.

Incidentally, in this annealing, an ozone gas or a nitrogen dioxide gas, instead of an oxygen gas, may be used as an oxidizing gas.

Subsequently, as shown in FIG. 14F, an amorphous PZT film is formed as a second ferroelectric film 72c to have a thickness of approximately 20 nm by means of sputtering. The second ferroelectric film 72c and the first ferroelectric film 72b are used as a ferroelectric film 72.

The second ferroelectric film 72c is not limited to a PZT film. For example, the second ferroelectric film 72c may be formed of a ferroelectric material having an $ABO_3$ perovskite structure (A=any one of Bi, Pb, Ba, Sr, Ca, Na, K, and rare-earth elements; B=any one of Ti, Zr, Nb, Ta, W, Mn, Fe, Co, and Cr).

Further, the second ferroelectric film 72c may be formed of a material obtained by doping PZT with at least one of lanthanum, calcium, strontium, and silicon. Alternatively, the second ferroelectric film 72c may be formed of a Bi layered compound such as $(Bi_{1-x}R_x)Ti_3O_{12}$ (R is a rare-earth element, and 0<x<1), $SrBi_2Ta_2O_9$, or $SrBi_4Ti_4O_{15}$.

Then, as shown in FIG. 14G, an iridium oxide film is formed on the ferroelectric film 72. The iridium oxide film is formed to have a thickness of approximately 250 nm by use of sputtering, and is used as a second conductive film 73. Incidentally, it is suffice that the second conductive film 73 be formed of a noble metal film or a noble metal oxide film. Instead of the above-described iridium oxide film, a noble metal film such as an iridium oxide or a platinum film may be formed as the second conductive film 73.

Next, as shown in FIG. 14H, the second conductive film 73, the ferroelectric film 72, and the first conductive film 71 described above are individually patterned in order from the lower tier to the upper tier by use of photolithography to respectively form an upper electrode 73a, a capacitor dielectric film 72a, and a lower electrode 71a, which constitute a ferroelectric capacitor Q. It should be noted that the first conductive film 71 is patterned so that a contact region CR of the lower electrode 71a protrudes from the capacitor dielectric film 72a.

Next, steps for obtaining the cross-sectional structure shown in FIG. 14I will be described.

First, an alumina film is formed on the entire surface of the upper side of the silicon substrate 1 as a first capacitor protection insulating film 80. The first capacitor protection insulating film 80 is used for protecting the capacitor Q from a reducing atmosphere such as hydrogen and for preventing the capacitor dielectric film 72a from deteriorating. The alumina film is formed to have a thickness of approximately 20 nm by, for example, sputtering.

Thereafter, in order to recover damage to the capacitor dielectric film 72a caused in the steps described so far due to etching, sputtering, and the like, recovery annealing is performed in an atmosphere of 100% oxygen in a furnace under conditions including a substrate temperature of 650° C. and a treatment time of 90 minutes.

Next, a silicon oxide film is formed on the first capacitor protection insulating film 80. The silicon oxide film is formed to have a thickness of approximately 1500 nm by means of plasma CVD using a TEOS gas as a reaction gas. The silicon oxide film is used as a second interlayer insulating film 81. In the upper surface of the second interlayer insulating film 81, unevenness, which reflects the existence of the shape of the capacitor Q, is formed. Accordingly, in order to eliminate the unevenness, the upper surface of the second interlayer insulating film 81 is polished and planarized by CMP. Thereby, the thickness of the second interlayer insulating film 81 on the flat surface of the first capacitor protection insulating film 80 is reduced to approximately 1000 nm.

Thereafter, as treatment for dehydrating the second interlayer insulating film 81 made of silicon oxide, the surface of the second interlayer insulating film 81 is exposed to a $N_2O$ plasma. Instead of such $N_2O$ plasma treatment, the second interlayer insulating film 81 may be annealed in a furnace to be dehydrated.

Subsequently, an alumina film is formed on the second interlayer insulating film 81. The alumina film is formed, by sputtering, to have a thickness of approximately 50 nm as a second capacitor protection insulating film 82 for protecting the capacitor Q from hydrogen and water generated in later steps. Furthermore, a silicon oxide film is formed on the second capacitor protection insulating film 82 to have a thickness of approximately 200 nm by use of plasma CVD. This silicon oxide film is used as a cap insulating film 83.

Next, as shown in FIG. 14J, photoresist is applied over the cap insulating film 83 to be exposed and developed. Thus, a first resist pattern 85, which includes first and second windows 85a and 85b having the shapes of holes, is formed.

The insulating films 80 to 83 are dry-etched through the first and second windows 85a and 85b using a parallel-plate plasma etching chamber. Thereby, a first hole 81a is formed on the upper electrode 73a, and a second hole 81b is formed on the contact region CR of the lower electrode 71a.

The etching gas for this dry etching is not particularly limited. In this embodiment, a gas mixture of $C_4F_8$, Ar, $O_2$, and CO is used.

Thereafter, the first resist pattern 85 is removed.

Next, as shown in FIG. 14K, photoresist is again applied over the cap insulating film 83 to be exposed and developed. Thus, a second resist pattern 87, which includes third and fourth windows 87a and 87b having the shapes of holes, is formed over the first and second conductive plugs 32a and 32b, respectively. Note that the first and second holes 81a and 81b are covered with this second resist pattern 87.

Then, the insulating films 66 and 80 to 83 and the alumina film 67 are etched through the third and fourth windows 87a and 87b. Thereby, third and fourth holes 81c and 81d are respectively formed on the conductive plugs 32a and 32b. Such etching is performed by a parallel-plate plasma etching system which uses a gas mixture of $C_4F_8$, Ar, $O_2$, and CO as an etching gas. The anti-oxidation insulating film 65 serves as a stopper film in this etching, and the etching stops on the anti-oxidation insulating film 65.

Thereafter, the second resist pattern 87 is removed.

Next, steps for obtaining the cross-sectional structure shown in FIG. 14L will be described.

First, the silicon substrate 1 is placed in a parallel-plate plasma etching chamber, and a gas mixture of $CHF_3$, Ar, and $O_2$ is supplied to the etching system as an etching gas. Thus, the anti-oxidation insulating film 65 at the bottoms of the third and fourth holes 81c and 81d are exposed to an etching atmosphere to be removed. Consequently, the first and second conductive plugs 32a and 32b are exposed at the bottoms of these holes. Concurrently, foreign substances in the first and second holes 81a and 81b are removed. Thereby, the upper surfaces respectively of the upper electrode 73a and the lower electrode 71a are cleaned.

As described above, in the fifth embodiment, the third and fourth holes 81c and 81d which are deep, and which exist over the first and second source/drain regions 8a and 8b, are formed in a step different from that of forming the first and second holes 81a and 81b which are shallow, and which exist on the capacitor Q.

In contrast to this, it is also conceivable that all of the holes 81a to 81d are simultaneously formed. However, in this case, the etching time needs to be set in accordance with the third and fourth holes 81c and 81d which are deep, and the upper electrode 73a at the bottom of the first hole 81a, which is shallower than the third and fourth holes 81c and 81d, and which are formed in a short time, is exposed to an etching atmosphere for a long time. This causes the capacitor dielectric film 72a under the upper electrode 73a to deteriorate due to the etching atmosphere, and is therefore unfavorable.

On the other hand, in the fifth embodiment, the first and second holes 81a and 81b, which are shallow, and the third and fourth holes 81c and 81d, which are deep, are formed separately as described above. When the third and fourth holes 81c and 81d are formed, the first and second holes 81a and 81b are covered with the second resist pattern 87. Accordingly, it is made possible to suppress the deterioration of the capacitor dielectric film 72a.

Moreover, the first and second conductive plugs 32a and 32b are covered with the anti-oxidation insulating film 65 until the present step is finished. Accordingly, the tungsten constituting the conductive plugs 32a and 32b is prevented from being oxidized, and from causing a contact failure.

Next, steps for obtaining the cross-sectional structure shown in FIG. 14M will be described.

First, a titanium nitride film is formed as a glue film on the inner surfaces of the first to fourth holes 81a to 81d and on the upper surface of the cap insulating film 83. The glue film is formed to have a thickness of approximately 75 nm by use of sputtering. Then, in order to clean the surface of the glue film, the glue film is exposed to an atmosphere made by converting argon into a plasma with high-frequency power, and the upper surface of the glue film is sputter-etched.

Subsequently, a tungsten film is formed on the glue film by CVD. Thereby, the first to fourth holes 81a to 81d are completely buried with the tungsten film.

Thereafter, unnecessary portions of the glue film and the tungsten film on the upper surface of the cap insulating film 83 are polished and removed by CMP to leave these films only in the holes 81a to 81d. These films left in the first and second holes 81a and 81b are used as third and fourth conductive plugs 90a and 90b electrically connected to the upper electrode 73a and the contact region CR of the lower electrode 71a, respectively. Furthermore, these films left in the third and fourth holes 81c and 81d are used as fifth and sixth conductive plugs 90c and 90d electrically connected to the first and second conductive plugs 32a and 32b, respectively.

Next, steps for obtaining the cross-sectional structure shown in FIG. 14N will be described.

First, a titanium film having a thickness of approximately 60 nm and a titanium nitride film having a thickness of approximately 30 nm are formed in order from the lower tier to the upper tier on the cap insulating film 83 and the third to sixth conductive plugs 90a to 90d by sputtering. These films are together used as a barrier metal layer. Then, by sputtering, a copper-containing aluminum film, a titanium film, and a titanium nitride film are formed, together as a metal film stack, in order from the lower tier to the upper tier on this barrier metal layer to thicknesses of approximately 360 nm, 5 nm, and 70 nm, respectively.

Next, an unillustrated silicon oxynitride film is formed as an antireflection film on this metal film stack. Then, the metal film stack and the barrier metal layer described above are patterned by use of photolithography. Thereby, first-layer metal interconnections 92a and 92b and a conductive pad 92c are formed.

Subsequently, a silicon oxide film is formed as a fourth insulating film 93 by plasma CVD. Then, the fourth insulating film 93 is planarized by CMP. Thereafter, the fourth insulating film 93 is patterned by photolithography to form a hole on the conductive pad 92c, and a seventh conductive plug 94 consisting primarily of a tungsten film is formed in the hole.

Thereafter, steps are performed for forming second- to fifth-layer metal interconnections and for forming interlayer insulating films between these metal interconnections. However, details thereof will not be described.

By the above-described steps, the basic structure of the planar FeRAM according to the fifth embodiment is completed.

In this embodiment described above, the capacitor dielectric film 72a is formed of the first and second ferroelectric films 72b and 72c. Moreover, the first ferroelectric film 72b is formed by MOCVD, and is annealed in an atmosphere containing an oxidizing gas. Accordingly, as in the first embodiment, impurities, such as organic materials introduced into the first ferroelectric film 72c during deposition thereof and exposure thereof to the air, are expelled outside the film. As a result, the film quality of the capacitor dielectric film 72a is improved, and it is made possible to simultaneously achieve an increase in the switching charge, a decrease in the leakage current, a decrease in the fatigue, and an improvement in imprint characteristics.

According to the present invention described above, the capacitor dielectric film has a two-layer structure including the first and second ferroelectric films, and the first ferroelectric film is annealed. Accordingly, it is made possible to provide a semiconductor device including a capacitor in which an increase in the switching charge amount, a decrease in the leakage current, a decrease in the fatigue, and an improvement in imprint characteristics are simultaneously achieved.

What is claimed is:

1. A method of manufacturing a semiconductor device, comprising the steps of:
    forming a first interlayer insulating film over a semiconductor substrate;
    forming a first conductive film on the first interlayer insulating film;
    forming a first ferroelectric film, which is crystallized, on the first conductive film;
    annealing the first ferroelectric film;
    after the annealing, forming a second ferroelectric film made of any one of an amorphous material and a microcrystalline material on the first ferroelectric film;
    forming a second conductive film on the second ferroelectric film; and
    forming a capacitor including a lower electrode, a capacitor dielectric film, and an upper electrode by patterning the first conductive film, the first ferroelectric film, the second ferroelectric film, and the second conductive film;
    wherein the step of forming the second conductive film further includes the steps of:
    forming a first metal oxide film;
    forming, on the first metal oxide film, a second metal oxide film containing a larger amount of oxygen than that in the first metal oxide film; and
    forming a conductivity-improving film on the second metal oxide film.

2. The method of manufacturing a semiconductor device according to claim 1, wherein a thickness of the second ferroelectric film is equal to, or less than, 40% of that of the first ferroelectric film.

3. The method of manufacturing a semiconductor device according to claim 1, wherein the annealing is performed in an atmosphere containing an oxidizing gas.

4. The method of manufacturing a semiconductor device according to claim 3, wherein, as the oxidizing gas, any one of an oxygen gas, an ozone gas, and a nitrogen dioxide gas is used.

5. The method of manufacturing a semiconductor device according to claim 1, wherein
    the annealing is performed by atmospheric-pressure RTA,
    a lower limit of a substrate temperature in the annealing is 45° C. lower than a deposition temperature for the first ferroelectric film, and
    an upper limit of the substrate temperature is 30° C. higher than the deposition temperature.

6. The method of manufacturing a semiconductor device according to claim 1, wherein
    the annealing is performed by reduced-pressure RTA,
    a lower limit of a substrate temperature in the annealing is 55° C. lower than a deposition temperature for the first ferroelectric film, and
    an upper limit of the substrate temperature is 20° C. higher than the deposition temperature.

7. The method of manufacturing a semiconductor device according to claim 1, wherein the step of forming the first ferroelectric film, which is crystallized, is performed by MOCVD.

8. The method of manufacturing a semiconductor device according to claim 1, wherein, as the second ferroelectric film, a film made of an amorphous material is formed by sputtering.

9. The method of manufacturing a semiconductor device according to claim 1, further comprising the step of annealing the first metal oxide film in an oxygen-containing atmosphere after the step of forming the first metal oxide film and before the step of forming the second metal oxide film.

10. The method of manufacturing a semiconductor device according to claim 1, wherein,
    in the step of forming the first metal oxide film, the first metal oxide film, which is crystallized, is formed by sputtering in which the semiconductor substrate is heated, and
    in the step of forming the second metal oxide film, the second metal oxide film is formed to be in an amorphous state by sputtering in which a substrate temperature is room temperature.

11. The method of manufacturing a semiconductor device according to claim 1, wherein, as the first and second metal oxide films, films made of oxide of any one of iridium, ruthenium, rhodium, rhenium, osmium, and palladium are formed.

12. The method of manufacturing a semiconductor device according to claim 1, wherein, as the conductivity-improving film, any one of an iridium film, a platinum film, and a $SrRuO_3$ film is formed.

13. The method of manufacturing a semiconductor device according to claim 1, wherein, a film, which is made of a ferroelectric material having any one of a perovskite structure and a Bi layered structure, is formed as the first ferroelectric film.

14. The method of manufacturing a semiconductor device according to claim 1, wherein, in the step of forming the capacitor, a plurality of capacitors are formed in an array.

15. The method of manufacturing a semiconductor device according to claim 1, further comprising the steps of:
    forming a first impurity diffusion region and a second impurity diffusion region in the semiconductor substrate;
    forming a first hole in the first interlayer insulating film over the first impurity diffusion region; and
    forming a first conductive plug in the first hole,
    wherein, in the step of forming the capacitor, the capacitor is formed over the first conductive plug, and
    the lower electrode and the first conductive plug are electrically connected to each other.

16. The method of manufacturing a semiconductor device according to claim 15, further comprising the steps of:
    forming an underlying insulating film on the first interlayer insulating film and on the first conductive plug;
    forming a second hole in the underlying insulating film on the first conductive plug;
    forming, in the second hole, a second conductive plug electrically connected to the first conductive plug;
    forming an underlying conductive film on the underlying insulating film and on the second conductive plug; and
    forming a conductive oxygen barrier film on the underlying conductive film,
    wherein, in the step of forming the first conductive film, the first conductive film is formed on the conductive oxygen barrier film.

17. The method of manufacturing a semiconductor device according to claim 16, further comprising the steps of:
    forming a planarization conductive film on the second conductive plug and on the underlying insulating film after forming the second conductive plug; and
    planarizing the planarization conductive film,
    wherein, in the step of forming the underlying conductive film, the underlying conductive film is formed on the planarization conductive film.

18. The method of manufacturing a semiconductor device according to claim 16, further comprising the steps of:
- forming a third hole in the first interlayer insulating film over the second impurity diffusion region;
- forming a third conductive plug in the third hole;
- forming an anti-oxidation insulating film, in which the second hole is formed, on the first interlayer insulating film, on the first conductive plug, and on the third conductive plug before forming the underlying insulating film;
- forming a second interlayer insulating film covering the capacitor after forming the capacitor;
- forming a fourth hole in the anti-oxidation insulating film, the underlying insulating film, and the second interlayer insulating film which are on the third hole; and
- forming, in the fourth hole, a fourth conductive plug electrically connected to the third conductive plug.

19. The method of manufacturing a semiconductor device according to claim 1, wherein,
in the step of forming the capacitor, the first conductive film is patterned in a manner that a contact region of the lower electrode protrudes from the capacitor dielectric film, and
the method further includes the steps of:
- forming a second interlayer insulating film covering the capacitor;
- forming a first hole in the second interlayer insulating film on the contact region;
- forming a second hole in the second interlayer insulating film on the upper electrode;
- forming, in the first hole, a first conductive plug electrically connected to the lower electrode; and
- forming, in the second hole, a second conductive plug electrically connected to the upper electrode.

* * * * *

UNITED STATES PATENT AND TRADEMARK OFFICE
CERTIFICATE OF CORRECTION

PATENT NO.        : 7,550,302 B2                                           Page 1 of 1
APPLICATION NO.   : 11/554300
DATED             : January 20, 2010
INVENTOR(S)       : Wensheng Wang et al.

It is certified that error appears in the above-identified patent and that said Letters Patent is hereby corrected as shown below:

On the title page:
In Item 30 Foreign Application Priority Data, change "Jan. 30, 1966" to -- Jun. 30, 2006 --

Signed and Sealed this

Twenty-seventh Day of April, 2010

David J. Kappos
*Director of the United States Patent and Trademark Office*